United States Patent
Hatate et al.

(10) Patent No.: US 9,099,643 B2
(45) Date of Patent: Aug. 4, 2015

(54) METHOD OF ETCHING A MAGNESIUM OXIDE FILM

(71) Applicant: TDK CORPORATION, Tokyo (JP)

(72) Inventors: Hitoshi Hatate, Tokyo (JP); Atsuyoshi Tsunoda, Tokyo (JP); Makoto Fukui, Tokyo (JP); Shuji Okame, Tokyo (JP); Ken Fujii, Tokyo (JP)

(73) Assignee: TDK CORPORATION, Tokyo (JP)

( * ) Notice: Subject to any disclaimer, the term of this patent is extended or adjusted under 35 U.S.C. 154(b) by 285 days.

(21) Appl. No.: 13/777,352

(22) Filed: Feb. 26, 2013

(65) Prior Publication Data

US 2014/0242728 A1 Aug. 28, 2014

(51) Int. Cl.
*H01L 21/00* (2006.01)
*H01L 43/12* (2006.01)
*G11B 5/39* (2006.01)
*G01R 33/09* (2006.01)

(52) U.S. Cl.
CPC .............. *H01L 43/12* (2013.01); *G01R 33/093* (2013.01); *G01R 33/098* (2013.01); *G11B 5/3909* (2013.01); *G11B 2005/3996* (2013.01)

(58) Field of Classification Search
CPC .......... H01L 42/12; H01L 21/02; H01L 21/00
USPC .......... 438/2–5; 257/295, 421, 536, E21.002, 257/E29.32, E21.665
See application file for complete search history.

(56) References Cited

U.S. PATENT DOCUMENTS

| 5,364,415 A * | 11/1994 | Lewis ............................. 8/406 |
| 6,090,214 A * | 7/2000 | Zhou et al. ....................... 134/6 |
| 2004/0117976 A1 | 6/2004 | Sato et al. |
| 2007/0241410 A1* | 10/2007 | Umehara et al. .............. 257/379 |
| 2008/0096290 A1* | 4/2008 | Smith et al. ....................... 438/3 |
| 2008/0253039 A1* | 10/2008 | Nagamine et al. ......... 360/324.2 |
| 2010/0112728 A1* | 5/2010 | Korzenski et al. .............. 438/3 |
| 2011/0134689 A1* | 6/2011 | Hayakawa ................... 365/171 |
| 2012/0276657 A1* | 11/2012 | Joubert et al. ................... 438/3 |
| 2013/0069184 A1* | 3/2013 | Aikawa et al. ................ 257/421 |
| 2013/0264665 A1* | 10/2013 | Jan et al. ....................... 257/421 |
| 2013/0288393 A1* | 10/2013 | Hautala ............................ 438/3 |
| 2013/0288394 A1* | 10/2013 | Kontos et al. .................... 438/3 |
| 2014/0116985 A1* | 5/2014 | Satake et al. ................... 216/22 |

FOREIGN PATENT DOCUMENTS

| JP | A-5-166132 | 7/1993 |
| JP | B2-5-84567 | 12/1993 |
| JP | A-9-63844 | 3/1997 |
| JP | A-2004-199812 | 7/2004 |

* cited by examiner

*Primary Examiner* — Yuanda Zhang
*Assistant Examiner* — Sheikh Maruf
(74) *Attorney, Agent, or Firm* — Oliff PLC

(57) ABSTRACT

A magnetoresistive device includes an MR element including a metal layer, and an insulating portion made of magnesium oxide and in contact with the MR element. A method of manufacturing the magnetoresistive device includes the step of removing an unwanted magnesium oxide film that is formed by the magnesium oxide in the process of forming the insulating portion. In this step, the unwanted magnesium oxide film is wet etched by using an etchant containing an aqueous ammonia solution.

10 Claims, 23 Drawing Sheets

METHOD OF ETCHING A MAGNESIUM OXIDE FILM

BACKGROUND OF THE INVENTION

1. Field of the Invention

The present invention relates to a method of etching a magnesium oxide film that is adjacent to a metal layer.

2. Description of the Related Art

With recent improvements in recording density of magnetic recording devices such as magnetic disk drives, there has been a demand for improving the performance of thin-film magnetic heads. Among the thin-film magnetic heads, a composite thin-film magnetic head has been used widely. The composite thin-film magnetic head has such a structure that a read head unit including a magnetoresistive element (hereinafter, also referred to as MR element) for reading and a write head unit including an induction-type electromagnetic transducer for writing are stacked on a substrate. Each thin-film magnetic head has a medium facing surface to face a recording medium.

Examples of MR elements include a giant magnetoresistive (GMR) element utilizing a giant magnetoresistive effect and a tunneling magnetoresistive (TMR) element utilizing a tunneling magnetoresistive effect.

Read head units are required to have high sensitivity and high output characteristics. As the read head units that satisfy such requirements, those incorporating spin-valve GMR elements or TMR elements have been mass-produced.

Spin-valve GMR elements and TMR elements each typically include a free layer, a pinned layer, a spacer layer disposed between the free layer and the pinned layer, and an antiferromagnetic layer disposed on a side of the pinned layer opposite from the spacer layer. The free layer is a ferromagnetic layer whose magnetization direction varies in response to a signal magnetic field. The pinned layer is a ferromagnetic layer whose magnetization direction is pinned. The antiferromagnetic layer is to pin the magnetization direction of the pinned layer by means of exchange coupling with the pinned layer. For spin-valve GMR elements, the spacer layer is a nonmagnetic conductive layer. For TMR elements, the spacer layer is a tunnel barrier layer. The tunnel barrier layer is typically formed of an insulating material such as aluminum oxide ($Al_2O_3$) or magnesium oxide (MgO).

Examples of GMR elements include one having a current-in-plane (CIP) structure in which a current for magnetic signal detection (hereinafter referred to as sense current) is fed in a direction parallel to the planes of the layers constituting the GMR element, and one having a current-perpendicular-to-plane (CPP) structure in which the sense current is fed in a direction intersecting the planes of the layers constituting the GMR element, such as a direction perpendicular to the planes of the layers constituting the GMR element. TMR elements have the CPP structure.

Now, an example of the configuration of a read head unit incorporating an MR element of the CPP structure will be described. The read head unit includes first and second electrodes located at a distance from each other, and an MR element interposed between the first and second electrodes. The MR element has a first surface in contact with the first electrode, a second surface in contact with the second electrode, a front end face located in the medium facing surface, a rear end face opposite to the front end face, and first and second side surfaces opposite to each other in the track width direction. The first and second electrodes are used for feeding a sense current to the MR element. Each of the first and second electrodes may also function as a shield for the MR element.

The read head unit further includes first and second bias magnetic field applying layers located on opposite sides of the MR element in the track width direction, a first insulating film interposed between the first bias magnetic field applying layer and the first side surface of the MR element, a second insulating film interposed between the second bias magnetic field applying layer and the second side surface of the MR element, and an insulating refill layer disposed around the MR element and the first and second bias magnetic field applying layers.

The first and second bias magnetic field applying layers apply to the MR element a bias magnetic field for orienting the magnetization of the free layer in a predetermined direction when no signal magnetic field is applied to the MR element. The first and second bias magnetic field applying layers include respective metal layers each made of a magnetic alloy. The metal layers are exposed in the respective top surfaces of the first and second bias magnetic field applying layers, for example. The insulating refill layer is in contact with the rear end face of the MR element. The insulating refill layer is made of an insulating material. The read heat unit having such a configuration is disclosed in JP-A-2004-199812, for example.

An example of the manufacturing method for the aforementioned read head unit will now be described. In the manufacturing method, first, an MR film that later becomes the MR element is formed on the first electrode. The MR film is composed of a plurality of layers stacked. The uppermost layer of the MR film is typically a metal layer. Then, the MR film is selectively etched using a first mask to provide the MR film with the aforementioned first and second side surfaces. Next, the first and second insulating films and the first and second bias magnetic field applying layers are formed in succession, and the first mask is removed. The MR film is then selectively etched using a second mask to provide the MR film with the aforementioned rear end face. Next, the insulating refill layer is formed and the second mask is removed. The second electrode is then formed on the MR film.

To manufacture a magnetic head including the read head unit described above, components of a plurality of magnetic heads other than the substrates are formed on a single wafer that includes portions to later become the substrates of the plurality of magnetic heads, whereby a substructure including rows of a plurality of pre-head portions is fabricated. The plurality of pre-head portions become individual magnetic heads later. Then, the plurality of pre-head portions are separated from each other by cutting the substructure, and the cut surfaces are polished to form medium facing surfaces. The formation of the medium facing surfaces provides the MR films with the front end faces, thereby making the MR films into MR elements.

In the process of manufacturing the read head unit described above, the insulating material used to form the first and second insulating films and/or the insulating material used to form the insulating refill layer may deposit on the MR film into an unwanted insulating film. If the unwanted insulating film remains on the MR film, there may occur continuity failure between the MR element and the second electrode. It is thus necessary to remove the unwanted insulating film.

For example, wet etching is employed to remove the unwanted insulating film. The wet etching needs to be performed under such a condition that the metal layers adjacent to the unwanted insulating film, that is, the uppermost metal layer of the MR film and the metal layers of the first and second bias magnetic field applying layers, are not etched at all or are hardly etched.

JP-A-2004-199812 discloses removing an unwanted insulating film of $Al_2O_3$ by wet etching using tetramethylammonium hydroxide as the etchant.

Here, a case will be contemplated in which the first and second insulating films are formed of magnesium oxide. In this case, the unwanted insulating film is formed by magnesium oxide. Thus, in such a case, a wet etching method is needed that can selectively etch a magnesium oxide film adjacent to a metal layer. However, such a method has not been known.

The inventors of the present application attempted to etch a magnesium oxide film by using tetramethylammonium hydroxide as the etchant, and found, however, that the magnesium oxide film was hardly etched.

OBJECTS AND SUMMARY OF THE INVENTION

It is a first object of the present invention to provide a method of etching a magnesium oxide film that allows a magnesium oxide film adjacent to a metal layer to be selectively etched by wet etching.

It is a second object of the present invention to provide a method of manufacturing a micro-device and a method of manufacturing a magnetoresistive device that allow an unwanted magnesium oxide film adjacent to a metal layer to be selectively etched by wet etching.

A method of etching a magnesium oxide film of the present invention includes the step of wet etching a magnesium oxide film that lies adjacent to a metal layer by using an etchant containing an aqueous ammonia solution.

In the method of etching a magnesium oxide film of the present invention, the etchant may further contain ammonium persulfate. In this case, the etchant has a pH preferably in the range of 9.0 to 10.0, and more preferably in the range of 9.3 to 9.6.

In the method of etching a magnesium oxide film of the present invention, the metal layer may contain one of Pt, Au, Ir, Ru, Rh, Pd, Ta, W, Zr, Nb, Mo, Mn, Fe, Ti, V, Si, Ge, Sn, Pr, Nd, Sm, Dy, Er, and NiCr. Alternatively, the metal layer may be made of a magnetic alloy.

A micro-device manufactured by a manufacturing method for a micro-device of the present invention includes an element including a metal layer, and an insulating portion in contact with the element. The element has a first surface and a second surface opposite to each other, and a third surface connecting the first and second surfaces to each other. The metal layer includes the second surface. The insulating portion is made of magnesium oxide.

The manufacturing method for the micro-device of the present invention includes the steps of forming an element film that later becomes the element, the element film having a top surface including a pre-second-surface portion that later becomes the second surface; patterning the element film so that the element film is provided with at least part of the third surface; forming the insulating portion from magnesium oxide such that the insulating portion is in contact with the at least part of the third surface; and removing an unwanted magnesium oxide film that has been formed on the pre-second-surface portion by the magnesium oxide in the step of forming the insulating portion. In the step of removing the unwanted magnesium oxide film, the unwanted magnesium oxide film is wet etched by using an etchant containing an aqueous ammonia solution.

In the manufacturing method for the micro-device of the present invention, the etchant may further contain ammonium persulfate. In this case, the etchant has a pH preferably in the range of 9.0 to 10.0, and more preferably in the range of 9.3 to 9.6. Further, the element may be a magnetoresistive element.

A magnetoresistive device manufactured by a manufacturing method for a magnetoresistive device of the present invention includes a first electrode and a second electrode located at a distance from each other, a magnetoresistive element including a metal layer and disposed between the first electrode and the second electrode, and an insulating portion in contact with the magnetoresistive element. The magnetoresistive element has a first surface in contact with the first electrode, a second surface in contact with the second electrode, and a third surface connecting the first and second surfaces to each other. The metal layer includes the second surface. The insulating portion is made of magnesium oxide.

The manufacturing method for the magnetoresistive device of the present invention includes the steps of forming the first electrode; forming a magnetoresistive film on the first electrode, the magnetoresistive film becoming the magnetoresistive element later and having a top surface including a pre-second-surface-portion that later becomes the second surface; patterning the magnetoresistive film so that the magnetoresistive film is provided with at least part of the third surface; forming the insulating portion from magnesium oxide such that the insulating portion is in contact with the at least part of the third surface; removing an unwanted magnesium oxide film that has been formed on the pre-second-surface portion by the magnesium oxide in the step of forming the insulating portion; and forming the second electrode after the step of removing the unwanted magnesium oxide film. In the step of removing the unwanted magnesium oxide film, the unwanted magnesium oxide film is wet etched by using an etchant containing an aqueous ammonia solution.

In the manufacturing method for the magnetoresistive device of the present invention, the etchant may further contain ammonium persulfate. In this case, the etchant has a pH preferably in the range of 9.0 to 10.0, and more preferably in the range of 9.3 to 9.6.

In the manufacturing method for the magnetoresistive device of the present invention, the magnetoresistive element may include a first magnetic layer, a second magnetic layer, and a magnesium oxide layer. The first magnetic layer is located between the first surface and the magnesium oxide layer. The second magnetic layer is located between the second surface and the magnesium oxide layer. The magnesium oxide layer has an end located in the third surface. The insulating portion is in contact with the end of the magnesium oxide layer.

In the manufacturing method for the magnetoresistive device of the present invention, the magnetoresistive device may be for use in a thin-film magnetic head having a medium facing surface facing a recording medium. In this case, the third surface of the magnetoresistive element may include a front end face located in the medium facing surface, a rear end face opposite to the front end face, and a first side surface and a second side surface opposite to each other in the track width direction.

In the step of patterning the magnetoresistive film, an etching mask may be formed on the magnetoresistive film and the magnetoresistive film may be dry etched by using the etching mask to thereby provide the magnetoresistive film with the first and second side surfaces. In the step of forming the insulating portion, the insulating portion may be formed to be in contact with the first and second side surfaces with the etching mask left unremoved. In the step of removing the unwanted magnesium oxide film, the unwanted magnesium oxide film may be wet etched after the etching mask is removed. The etching mask may include a first portion located above the pre-second-surface portion, and a second portion that is in contact with a part of the top surface of the magnetoresistive film other than the pre-second-surface portion and supports the first portion.

The magnetoresistive device may further include a first bias magnetic field applying layer and a second bias magnetic field applying layer that apply a bias magnetic field to the magnetoresistive element. The first bias magnetic field applying layer is adjacent to the first side surface with the insulating portion interposed therebetween, and the second bias magnetic field applying layer is adjacent to the second side surface with the insulating portion interposed therebetween. Each of the first and second bias magnetic field applying layers has a top surface and includes a metal layer made of a magnetic alloy and exposed in the top surface. In this case, the manufacturing method for the magnetoresistive device of the present invention further includes the step of forming the first and second bias magnetic field applying layers.

In the step of patterning the magnetoresistive film, an etching mask may be formed on the magnetoresistive film and the magnetoresistive film may be dry etched by using the etching mask to thereby provide the magnetoresistive film with the rear end face. In the step of forming the insulating portion, the insulating portion may be formed to be in contact with the rear end face with the etching mask left unremoved. In the step of removing the unwanted magnesium oxide film, the unwanted magnesium oxide film may be wet etched after the etching mask is removed. The etching mask may have an undercut.

The method of etching a magnesium oxide film of the present invention makes it possible to selectively etch a magnesium oxide film adjacent to a metal layer by wet etching.

The method of manufacturing a micro-device and the method of manufacturing a magnetoresistive device of the present invention each make it possible to selectively etch an unwanted magnesium oxide film adjacent to a metal layer by wet etching.

Other and further objects, features and advantages of the present invention will appear more fully from the following description.

DETAILED DESCRIPTION OF THE PREFERRED EMBODIMENT

Figure 4:
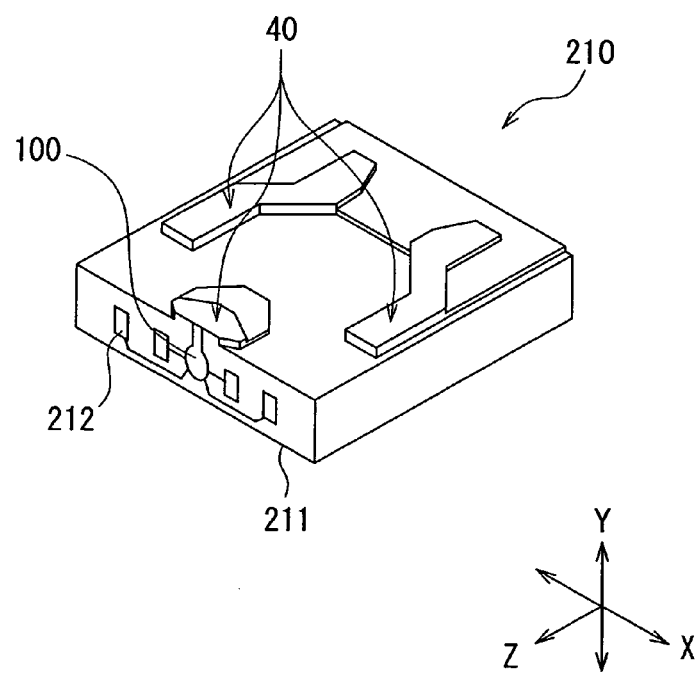
FIG. 4 is a perspective view showing a slider including the magnetic head of the embodiment of the invention.

An embodiment of the present invention will now be described in detail with reference to the drawings. First, with reference to FIG. 4, a description will be given of a slider 210 including a thin-film magnetic head (hereinafter, simply referred to as magnetic head) that incorporates a magnetoresistive device according to the embodiment of the invention. The magnetic head of the embodiment is for use in perpendicular magnetic recording. In a magnetic recording device, the slider 210 is disposed to face a circular-plate-shaped recording medium (a magnetic disk) that is driven to rotate. In FIG. 4, the X direction is a direction across the tracks of the recording medium, i.e., the track width direction; the Y direction is a direction perpendicular to the surface of the recording medium; and the Z direction is the direction of travel of the recording medium when viewed from the slider 210. The X, Y, and Z directions are orthogonal to one another. The slider 210 has a base body 211. The base body 211 is generally hexahedron-shaped. One of the six surfaces of the base body 211 is designed to face the surface of the recording medium. At this one of the six surfaces, there is formed a medium facing surface 40 to face the recording medium. When the recording medium rotates and travels in the Z direction, an airflow passing between the recording medium and the slider 210 causes a lift below the slider 210 in the Y direction of FIG. 4. The lift causes the slider 210 to fly over the surface of the recording medium. The magnetic head 100 of the embodiment is formed near the air-outflow-side end (the end in the Z direction) of the slider 210. A plurality of terminals 212 are also provided at the air-outflow-side end of the slider 210.

A head assembly of the embodiment will now be described with reference to FIG. 5. The head assembly of the embodiment includes the slider 210 shown in FIG. 4 and a supporter that flexibly supports the slider 210. Forms of the head assembly include a head gimbal assembly and a head arm assembly described below.

The head gimbal assembly 220 will be described first. The head gimbal assembly 220 includes the slider 210, and a suspension 221 serving as the supporter that flexibly supports the slider 210. The suspension 221 includes: a plate-spring-shaped load beam 222 formed of, e.g., stainless steel; a flexure 223 to which the slider 210 is joined, the flexure 223 being provided at an end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of the recording medium 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 5:
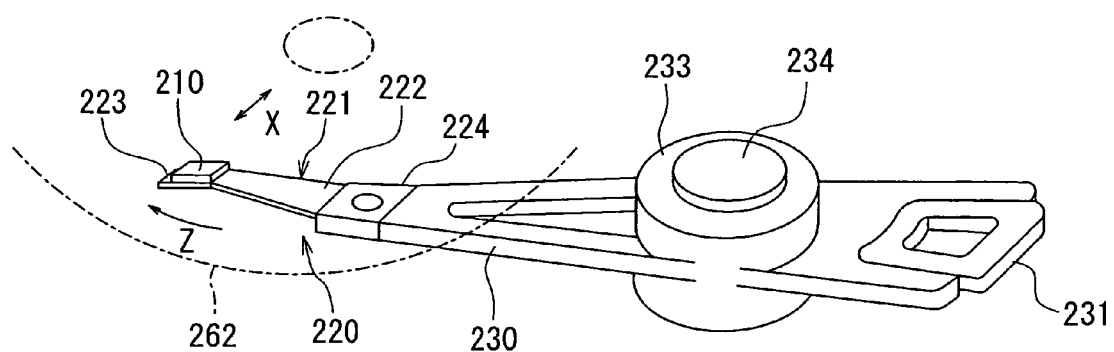
FIG. 5 is a perspective view showing a head arm assembly of the embodiment of the invention.

FIG. 5 shows the head arm assembly of the embodiment. In the head arm assembly, the head gimbal assembly 220 is attached to an end of the arm 230. A coil 231 that forms part of the voice coil motor is fixed to the other end of the arm 230. A bearing 233 is provided in the middle of the arm 230. The bearing 233 is attached to a shaft 234 for rotatably supporting the arm 230.

Figure 6:
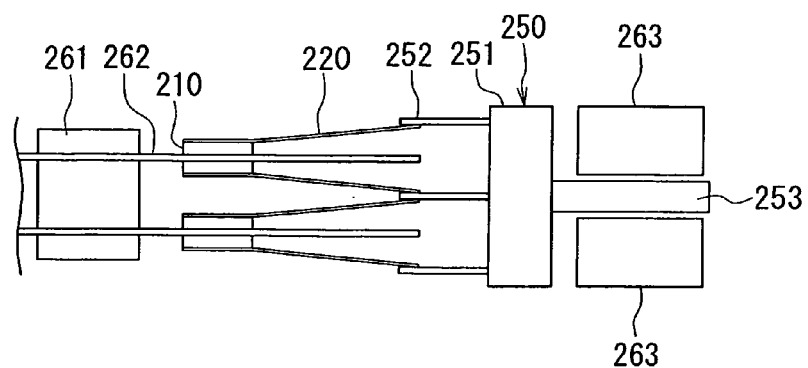
FIG. 6 is an explanatory diagram for illustrating the main part of a magnetic recording device of the embodiment of the invention.
Figure 7:
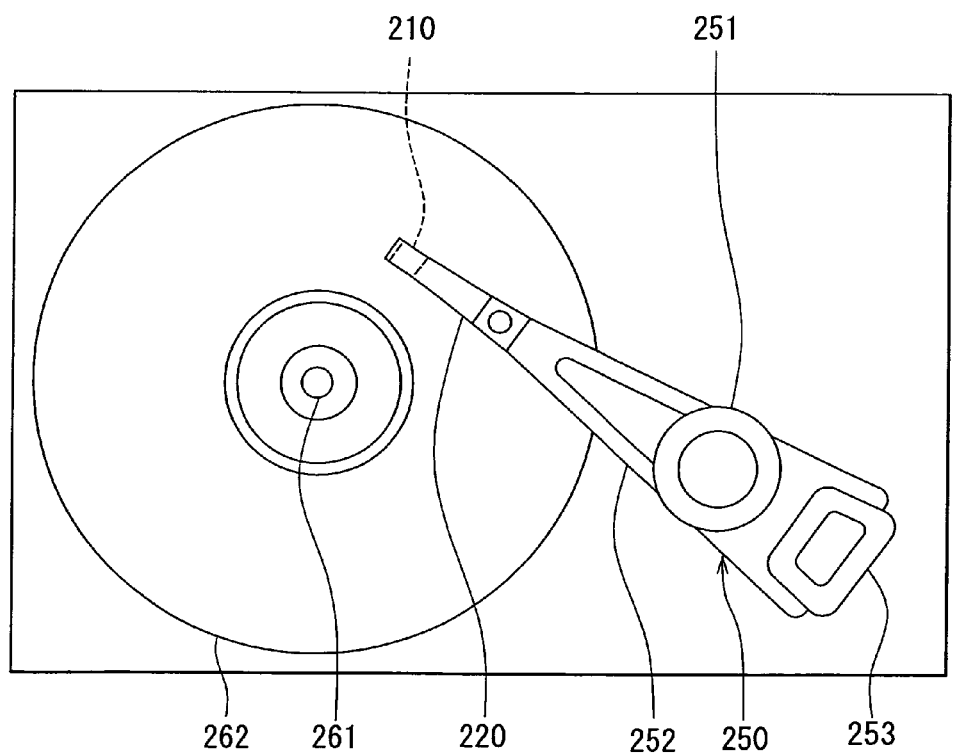
FIG. 7 is a plan view of the magnetic recording device of the embodiment of the invention.

Reference is now made to FIG. 6 and FIG. 7 to describe an example of the head stack assembly and a magnetic recording device of the embodiment. FIG. 6 is an explanatory diagram showing the main part of the magnetic recording device. FIG. 7 is a plan view of the magnetic recording device. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 forming part of the voice coil motor is mounted on a side of the carriage 251 opposite from the arms 252. The head stack assembly 250 is installed in the magnetic recording device. The magnetic recording device includes a plurality of recording media 262 mounted on a spindle motor 261. Two sliders 210 are allocated to each recording medium 262 such that the two sliders 210 are opposed to each other with the recording medium 262 interposed therebetween. The voice coil motor includes permanent magnets 263 arranged to be opposed to each other with the coil 253 of the head stack assembly 250 interposed therebetween. The actuator and the head stack assembly 250 except the sliders 210 support the sliders 210 and position them with respect to the recording media 262.

In the magnetic recording device, the actuator moves the slider 210 across the tracks of the recording medium 262 and positions the slider 210 with respect to the recording medium 262. The magnetic head included in the slider 210 has a write head unit to write data on the recording medium 262 and a read head unit to read data stored on the recording medium 262.

Figure 2:
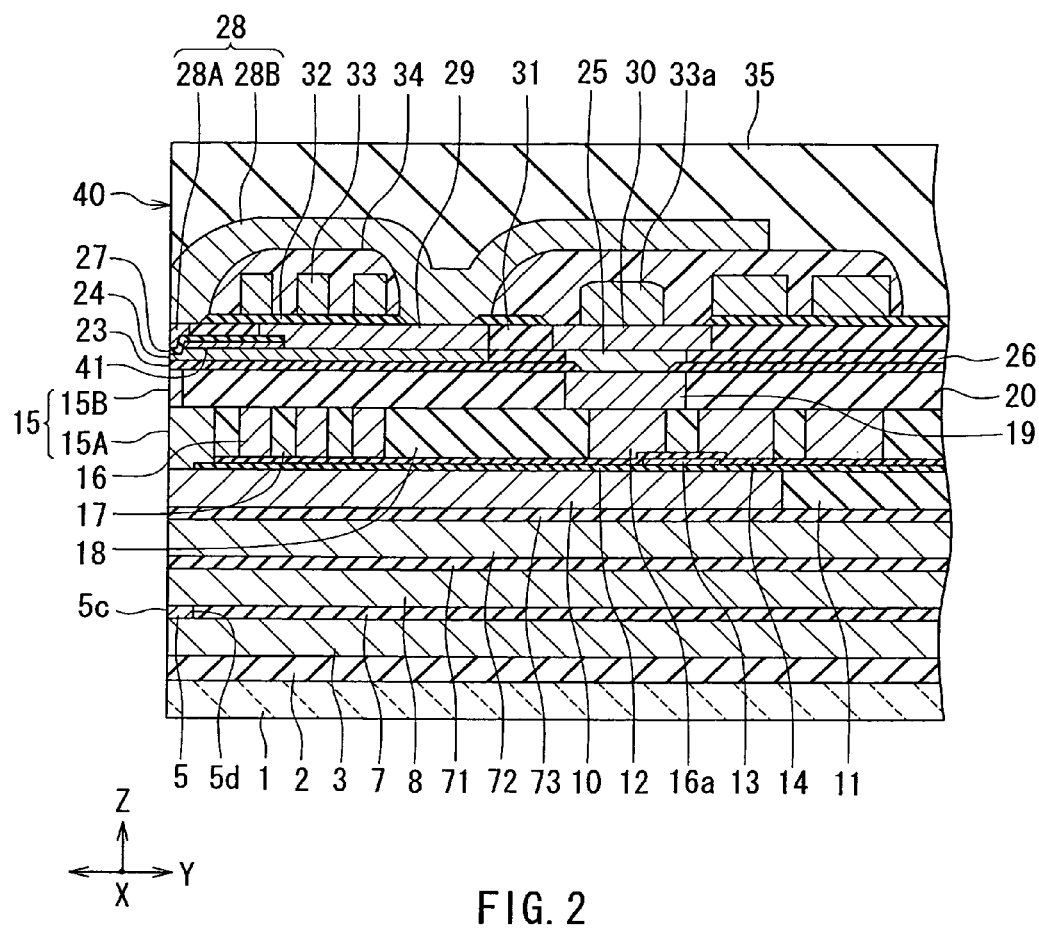
FIG. 2 is a cross-sectional view showing the configuration of a magnetic head of the embodiment of the invention.
Figure 3:
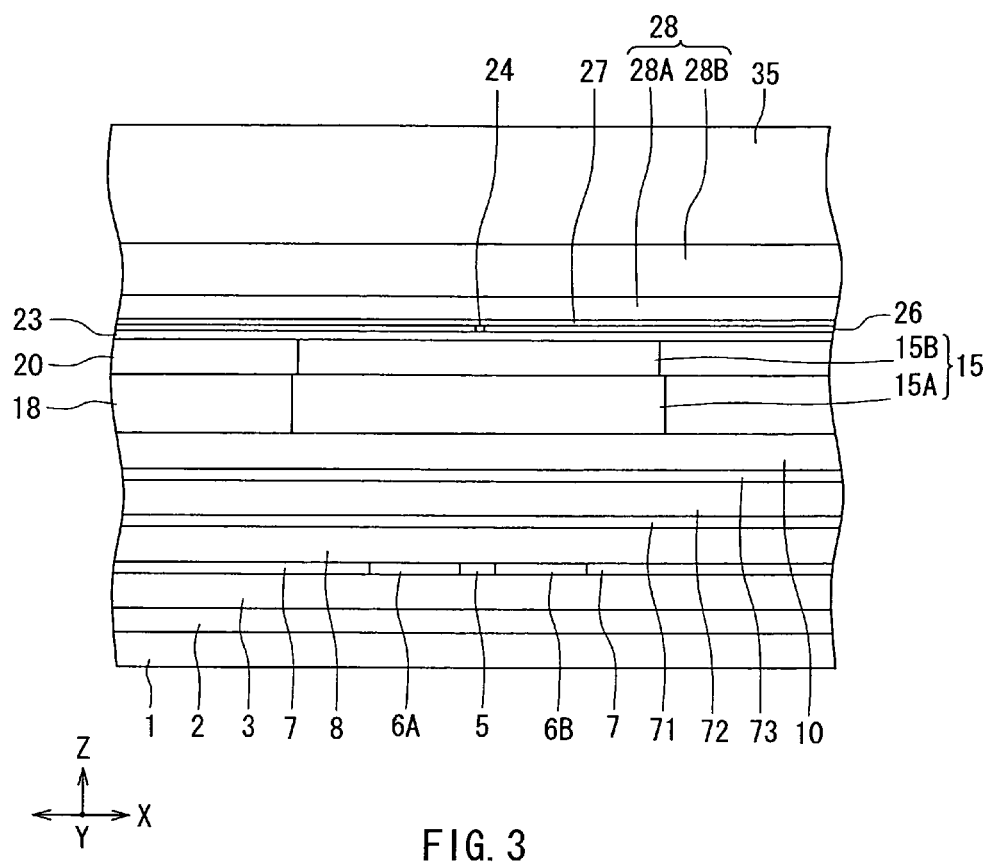
FIG. 3 is a front view showing the medium facing surface of the magnetic head of the embodiment of the invention.

The configuration of the magnetic head of the embodiment will now be described with reference to FIG. 2 and FIG. 3. FIG. 2 is a cross-sectional view showing the configuration of the magnetic head. FIG. 3 is a front view showing the medium facing surface of the magnetic head. Note that FIG. 2 shows a cross section perpendicular to the medium facing surface and to the top surface of the substrate. The X, Y, and Z directions shown in FIG. 4 are also shown in FIG. 2 and FIG. 3. In FIG. 2, the X direction is orthogonal to the Y and Z directions. In FIG. 3, the Y direction is orthogonal to the X and Z directions.

As shown in FIG. 2, the magnetic head of the embodiment has the medium facing surface 40 facing the recording medium. As shown in FIG. 2 and FIG. 3, the magnetic head includes a substrate 1 made of a ceramic material such as aluminum oxide-titanium carbide ($Al_2O_3$—TiC), an insulating layer 2 made of an insulating material such as alumina ($Al_2O_3$) and disposed on the substrate 1, a first electrode 3 disposed on the insulating layer 2, a magnetoresistive element (hereinafter referred to as MR element) 5 disposed on the first electrode 3, a first bias magnetic field applying layer 6A and a second bias magnetic field applying layer 6B located on opposite sides of the MR element 5 in the track width direction (the X direction in FIG. 3), an insulating refill layer 7 disposed around the MR element 5 and the bias magnetic field applying layers 6A and 6B, and a second electrode 8 disposed over the MR element 5, the bias magnetic field applying layers 6A and 6B and the insulating refill layer 7. The parts from the first electrode 3 to the second electrode 8 constitute the read head unit. The read head unit will be described in detail later.

The magnetic head further includes an insulating layer 71 disposed on the second electrode 8, a middle shield layer 72 made of a magnetic material and disposed on the insulating layer 71, a nonmagnetic layer 73 disposed on the middle shield layer 72, a sub-shield 10 made of a magnetic material and disposed on the nonmagnetic layer 73, and an insulating layer 11 disposed around the sub-shield 10. The insulating layers 71 and 11 and the nonmagnetic layer 73 are made of alumina, for example. The sub-shield 10 has an end face located in the medium facing surface 40. The top surfaces of the sub-shield 10 and the insulating layer 11 are even with each other.

The magnetic head further includes an insulating film 12 disposed over the sub-shield 10 and the insulating layer 11, a heater 13 disposed on the insulating film 12, and an insulating film 14 disposed over the insulating film 12 and the heater 13 so that the heater 13 is interposed between the insulating films 12 and 14. The function and material of the heater 13 will be described later. The insulating films 12 and 14 are each made of an insulating material such as alumina.

The magnetic head further includes a first write shield 15 disposed on the sub-shield 10. The first write shield 15 includes a first layer 15A located on the sub-shield 10 and a second layer 15B located on the first layer 15A. The first layer 15A and the second layer 15B are each made of a magnetic material. Each of the first layer 15A and the second layer 15B has an end face located in the medium facing surface 40.

The magnetic head further includes a coil 16 made of a conductive material and disposed on the insulating film 14, an insulating layer 17 filling the space between the coil 16 and the first layer 15A and the space between every adjacent turns of the coil 16, and an insulating layer 18 disposed around the first layer 15A, the coil 16 and the insulating layer 17. The coil 16 is planar spiral-shaped. The coil 16 includes a connecting portion 16a which is a portion near the inner end of the coil 16 and connected to another coil described later. The insulating layer 17 is made of a photoresist, for example. The insulating layer 18 is made of alumina, for example. The top surfaces of the first layer 15A, the coil 16, the insulating layer 17, and the insulating layer 18 are even with each other.

The magnetic head further includes a connecting layer 19 made of a conductive material and disposed on the connecting portion 16a, and an insulating layer 20 made of an insulating material such as alumina and disposed around the second layer 15B and the connecting layer 19. The connecting layer 19 may be made of the same material as that of the second layer 15B. The top surfaces of the second layer 15B, the connecting layer 19, and the insulating layer 20 are even with each other.

The magnetic head further includes a first gap layer 23 disposed over the second layer 15B, the connecting layer 19 and the insulating layer 20. The first gap layer 23 has an opening formed in the area corresponding to the top surface of the connecting layer 19. The first gap layer 23 is made of a nonmagnetic insulating material such as alumina.

The magnetic head further includes a pole layer 24 made of a magnetic material and disposed on the first gap layer 23, a connecting layer 25 made of a conductive material and disposed on the connecting layer 19, and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as that of the pole layer 24.

The magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material to be used for the nonmagnetic layer 41 include alumina and $SiO_2$. Examples of the metal material to be used for the nonmagnetic layer 41 include Ru and Ti.

The magnetic head further includes a second gap layer 27 disposed over a part of the pole layer 24 and the nonmagnetic layer 41. A part of the top surface of the pole layer 24 located away from the medium facing surface 40 and the top surface of the connecting layer 25 are not covered with the nonmagnetic layer 41 and the second gap layer 27. The second gap layer 27 is made of a nonmagnetic material such as alumina.

The magnetic head further includes a second write shield 28 disposed on the second gap layer 27. The second write shield 28 includes a first layer 28A disposed to adjoin the second gap layer 27, and a second layer 28B disposed on a side of the first layer 28A opposite from the second gap layer 27 and connected to the first layer 28A. The first layer 28A and the second layer 28B are each made of a magnetic material. Each of the first layer 28A and the second layer 28B has an end face located in the medium facing surface 40.

The magnetic head further includes a yoke layer 29 made of a magnetic material, located away from the medium facing surface 40 and lying on the pole layer 24, a connecting layer 30 made of a conductive material and lying on the connecting layer 25, and an insulating layer 31 made of an insulating material such as alumina and disposed around the first layer 28A, the yoke layer 29 and the connecting layer 30. The yoke layer 29 and the connecting layer 30 may be made of the same material as that of the first layer 28A. The top surfaces of the first layer 28A, the yoke layer 29, the connecting layer 30 and the insulating layer 31 are even with each other.

The magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a part of the top surface of the yoke layer 29 near an end thereof farther from the medium facing surface 40, and an opening for exposing the top surface of the connecting layer 30.

The magnetic head further includes a coil 33 made of a conductive material and disposed on the insulating layer 32. The coil 33 is planar spiral-shaped. The coil 33 includes a connecting portion 33a which is a portion near the inner end of the coil 33 and connected to the connecting portion 16a of the coil 16. The connecting portion 33a is connected to the connecting layer 30, and is connected to the connecting portion 16a via the connecting layers 19, 25, and 30.

The magnetic head further includes an insulating layer 34 disposed to cover the coil 33. The insulating layer 34 is made of a photoresist, for example. The second layer 28B of the second write shield 28 is disposed over the first layer 28A, the yoke layer 29 and the insulating layer 34, and connects the first layer 28A and the yoke layer 29 to each other.

The magnetic head further includes an overcoat layer 35 made of an insulating material such as alumina and disposed to cover the second layer 28B. The parts from the sub-shield 10 to the second layer 28B constitute the write head unit. The base body 211 of FIG. 4 is mainly composed of the substrate 1 and the overcoat layer 35 of FIG. 2.

As has been described, the magnetic head has the medium facing surface 40, the read head unit, and the write head unit. The read head unit and the write head unit are stacked on the substrate 1. The read head unit is located on the rear side in the direction of travel of the recording medium (the Z direction), i.e., located on the air-inflow-end side of the slider, relative to the write head unit. The magnetic head writes data on the recording medium with the write head unit, and reads data stored on the recording medium with the read head unit.

The write head unit includes the sub-shield 10, the first write shield 15, the coil 16, the first gap layer 23, the pole layer 24, the nonmagnetic layer 41, the second gap layer 27, the second write shield 28, the yoke layer 29, and the coil 33. The coils 16 and 33 produce magnetic fields corresponding to data to be written on the recording medium. The pole layer 24, the second write shield 28, and the yoke layer 29 form a magnetic path that passes a magnetic flux corresponding to the magnetic field produced by the coil 33. The pole layer 24 has an end face located in the medium facing surface 40, allows the magnetic flux corresponding to the magnetic field produced by the coil 33 to pass, and produces a write magnetic field for writing data on the recording medium by means of a perpendicular magnetic recording system.

The first write shield 15 captures a magnetic flux produced from the end face of the pole layer 24 located in the medium facing surface 40 and spreading in directions other than the direction perpendicular to the plane of the recording medium, and thereby prevents the magnetic flux from reaching the recording medium. It is thereby possible to improve the recording density. The sub-shield 10 has the function of allowing a magnetic flux that has been produced from the end face of the pole layer 24 and has magnetized the recording medium to flow back. The sub-shield 10 may be connected to a part of the pole layer 24 located away from the medium facing surface 40.

The second write shield 28 captures a magnetic flux produced from the end face of the pole layer 24 located in the medium facing surface 40 and spreading in directions other than the direction perpendicular to the plane of the recording medium, and thereby prevents the magnetic flux from reaching the recording medium. It is thereby possible to improve the recording density. Further, the second write shield 28 captures a disturbance magnetic field applied to the magnetic head from the outside thereof. This prevents the disturbance magnetic field from being intensively captured into the pole layer 24 and inducing erroneous writing on the recording medium. Moreover, the second write shield 28 has the function of allowing a magnetic flux that has been produced from the end face of the pole layer 24 and has magnetized the recording medium to flow back.

The function and material of the heater 13 will now be described. The heater 13 is provided for heating the components of the write head unit including the pole layer 24 so as to control the distance between the recording medium and the end face of the pole layer 24 located in the medium facing surface 40. Two leads, which are not illustrated, are connected to the heater 13. The heater 13 is formed of, for example, an NiCr film or a layered film composed of a Ta film, an NiCu film and a Ta film. The heater 13 is energized through the two leads and generates heat, thereby heating the components of the write head unit. This causes the components of the write head unit to expand, so that the end face of the pole layer 24 located in the medium facing surface 40 becomes closer to the recording medium.

While FIG. 2 and FIG. 3 show a write head unit for use in the perpendicular magnetic recording system, the write head unit of the embodiment may be one for use in the longitudinal magnetic recording system.

Figure 1:
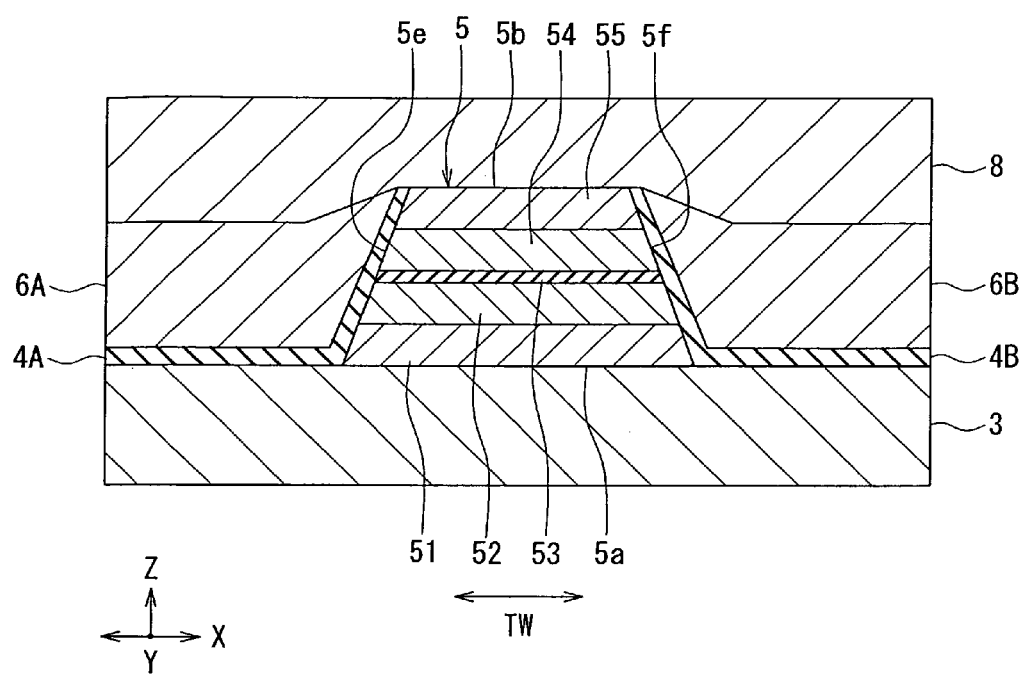
FIG. 1 is a cross-sectional view showing a cross section of a magnetoresistive device according to an embodiment of the invention parallel to the medium facing surface.

The read head unit will now be described in detail. The read head unit of the embodiment corresponds to the micro-device and the magnetoresistive device of the present invention. Hereinafter, the read head unit will be referred to as the micro-device or magnetoresistive device as appropriate. First, the configuration of the magnetoresistive device will be described in detail with reference to FIG. 1 and FIG. 2. FIG. 1 is a cross-sectional view showing a cross section of the magnetoresistive device parallel to the medium facing surface 40. The X, Y, and Z directions shown in FIG. 4 are also shown in FIG. 1. In FIG. 1, the Y direction is orthogonal to the X and Z directions. The arrow with the symbol TW in FIG. 1 indicates the track width direction. The track width direction TW is the same as the X direction. The magnetoresistive device according to the embodiment includes the first and second electrodes 3 and 8 located at a predetermined distance from each other, and the MR element 5 located between the first electrode 3 and the second electrode 8.

Used as the MR element 5 is an MR element having the current-perpendicular-to-plane (CPP) structure in which a sense current is fed in a direction intersecting the planes of layers constituting the MR element 5, such as a direction perpendicular to the planes of layers constituting the MR element 5. The first and second electrodes 3 and 8 are a pair of electrodes for feeding the sense current to the MR element 5 in the aforementioned direction. In the embodiment, in particular, the first and second electrodes 3 and 8 are each made of a magnetic alloy and also serve as shields for the MR element 5. Note that a pair of shields separate from the first and second electrodes 3 and 8 may be provided on top and bottom of the MR element 5.

The MR element 5 varies in resistance in response to an external magnetic field, that is, a signal magnetic field sent from the recording medium. The resistance of the MR element 5 can be determined from the sense current. It is thus possible with the magnetoresistive device (the read head unit) to read data stored on the recording medium.

The MR element 5 has a first surface 5$a$ in contact with the first electrode 3, a second surface 5$b$ in contact with the second electrode 8, and a third surface connecting the first surface 5$a$ and the second surface 5$b$ to each other. The third surface includes a front end face 5$c$ located in the medium facing surface 40, a rear end face 5$d$ opposite to the front end face 5$c$, and a first side surface 5$e$ and a second side surface 5$f$ opposite to each other in the track width direction TW. The first and second side surfaces 5$e$ and 5$f$ are inclined such that the distance between the first and second side surfaces 5$e$ and 5$f$ decreases toward the second surface 5$b$. The configuration of the MR element 5 will be described in detail later.

The magnetoresistive device further includes the first and second bias magnetic field applying layers 6A and 6B located on opposite sides of the MR element 5 in the track width direction TW, a first insulating film 4A, a second insulating film 4B, and the insulating refill layer 7 disposed around the MR element 5 and the bias magnetic field applying layers 6A and 6B.

The first and second bias magnetic field applying layers 6A and 6B apply a bias magnetic field to the MR element 5. Each of the first and second bias magnetic field applying layers 6A and 6B has a top surface, and includes a metal layer that is made of a magnetic alloy and exposed in the top surface. Each of the first and second bias magnetic field applying layers 6A and 6B may be formed of a hard magnetic layer (a hard magnet) that constitutes the metal layer made of a magnetic alloy, or a stack of an antiferromagnetic layer made of an antiferromagnetic material and a ferromagnetic layer that constitutes the metal layer made of a magnetic alloy. The metal layer of each of the first and second bias magnetic field applying layers 6A and 6B is made of CoPt or CoCrPt, for example.

The first insulating film 4A is interposed between the first bias magnetic field applying layer 6A and each of the MR element 5 and the first electrode 3. The first insulating film 4A is in contact with the first side surface 5$e$ of the MR element 5 and the top surface of the first electrode 3. The first bias magnetic field applying layer 6A is adjacent to the first side surface 5$e$ with the first insulating film 4A interposed therebetween.

The second insulating film 4B is interposed between the second bias magnetic field applying layer 6B and each of the MR element 5 and the first electrode 3. The second insulating film 4B is in contact with the second side surface 5$f$ of the MR element 5 and the top surface of the first electrode 3. The second bias magnetic field applying layer 6B is adjacent to the second side surface 5$f$ with the second insulating film 4B interposed therebetween.

The insulating refill layer 7 is in contact with the rear end face 5$d$ of the MR element 5. The first insulating film 4A, the second insulating film 4B, and the insulating refill layer 7 are made of magnesium oxide. The first insulating film 4A, the second insulating film 4B, and the insulating refill layer 7 each correspond to the insulating portion of the micro-device and the magnetoresistive device of the present invention.

The configuration of the MR element 5 will now be described in detail. FIG. 1 shows an example of the configuration of the MR element 5. In the embodiment, the MR element 5 is a TMR element utilizing the tunneling magnetoresistive effect. The MR element 5 includes a pinned layer 52 which is a magnetic layer whose magnetization direction is pinned, a free layer 54 which is a magnetic layer whose magnetization direction varies in response to a signal magnetic field serving as an external magnetic field, and a magnesium oxide layer 53 which is a tunnel barrier layer disposed between the pinned layer 52 and the free layer 54.

The bias magnetic field applied to the MR element 5 by the first and second bias magnetic field applying layers 6A and 6B is for orienting the magnetization of the free layer 54 in a predetermined direction when no signal magnetic field is applied to the MR element 5.

The pinned layer 52 is located between the first surface 5a and the magnesium oxide layer 53. The free layer 54 is located between the second surface 5b and the magnesium oxide layer 53. The pinned layer 52 corresponds to the first magnetic layer of the magnetoresistive device of the present invention, and the free layer 54 corresponds to the second magnetic layer of the magnetoresistive device of the present invention.

The magnesium oxide layer 53 has an end located in the third surface of the MR element 5. The end includes a first portion located in the first side surface 5e, a second portion located in the second side surface 5f, and a third portion located in the rear end face 5d. The first insulating film 4A is in contact with the first portion. The second insulating film 4B is in contact with the second portion. The insulating refill layer 7 is in contact with the third portion.

The MR element 5 further includes an antiferromagnetic layer 51 located on a side of the pinned layer 52 farther from the magnesium oxide layer 53, and a protective layer 55 made of a nonmagnetic metal and located on a side of the free layer 54 farther from the magnesium oxide layer 53. In the MR element 5 shown in FIG. 1, the antiferromagnetic layer 51, the pinned layer 52, the magnesium oxide layer 53, the free layer 54, and the protective layer 55 are stacked in this order on the first electrode 3. The antiferromagnetic layer 51 is to pin the magnetization direction of the pinned layer 52 by means of exchange coupling with the pinned layer 52. The magnetization direction of the pinned layer 52 is pinned by exchange coupling between the pinned layer 52 and the antiferromagnetic layer 51 at the interface therebetween. The protective layer 55 is provided for protecting the layers located thereunder, and includes the second surface 5b. The total thickness of the layers 51 to 55 is in the range of 20 to 30 nm, for example.

The antiferromagnetic layer 51 is made of an antiferromagnetic material such as PtMn, FeMn, or IrMn. The pinned layer 52 includes one or more ferromagnetic layers each made of a ferromagnetic material such as CoFe or CoFeB. The free layer 54 is made of a ferromagnetic material having a low coercivity. The protective layer 55 is formed of a single-layer film or a multi-layer film of nonmagnetic metal such as Au, Ru, Rh, Ta, or NiCr.

The antiferromagnetic layer 51, the pinned layer 52, the magnesium oxide layer 53, and the free layer 54 may be stacked in an order reverse to the example shown in FIG. 1. In such a case, the free layer 54 corresponds to the first magnetic layer of the magnetoresistive device of the present invention, and the pinned layer 52 corresponds to the second magnetic layer of the magnetoresistive device of the present invention.

In the embodiment, the insulating portion (the first insulating film 4A, the second insulating film 4B, and the insulating refill layer 7) is in contact with the end of the magnesium oxide layer 53. If the magnesium oxide layer 53 and the insulating portion are made of different materials, those materials may inter-diffuse between the magnesium oxide layer 53 and the insulating portion. In such a case, the quality of the magnesium oxide layer 53 serving as the tunnel barrier layer may deteriorate to cause degradation of the characteristics of the MR element 5. In the embodiment, however, both the magnesium oxide layer 53 and the insulating portion are made of magnesium oxide. Therefore, the aforementioned diffusion does not occur between the magnesium oxide layer 53 and the insulating portion. It is thus possible to prevent degradation of the characteristics of the MR element 5.

Magnesium oxide is higher in thermal expansion coefficient and Young's modulus than alumina, which is typically used as the material of insulating layers of a magnetic head. Thus, when compared with the case where the insulating refill layer 7 disposed around the MR element 5 is made of alumina, this embodiment allows a greater force to be applied to the pinned layer 52 of the MR element 5 when the insulating refill layer 7 expands due to a temperature increase of the magnetic head during its use. Further, when compared with the case where the insulating refill layer 7 is made of alumina, this embodiment allows a greater stress to be applied to the pinned layer 52 of the MR element 5 during the polishing of the medium facing surface 40 in the process of manufacturing the magnetic head to be described later. Consequently, according to this embodiment, it is possible to provide the pinned layer 52 with magnetic anisotropy created by the inverse magnetostriction effect and thereby stabilize the magnetization direction of the pinned layer 52.

Figure 8:
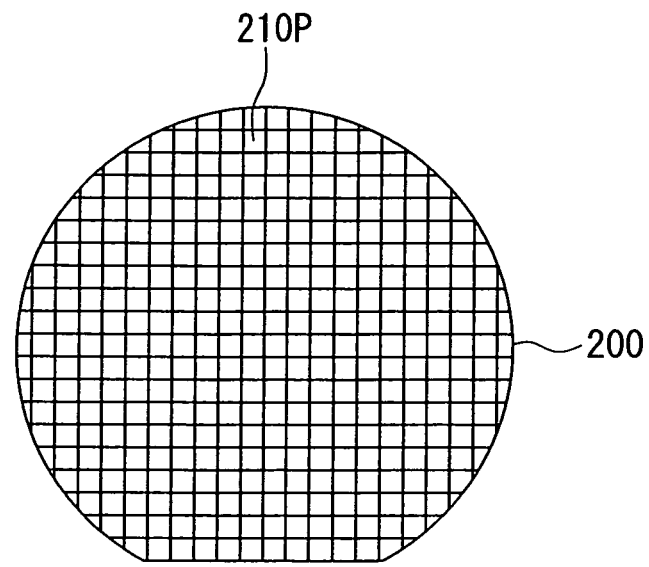
FIG. 8 is a plan view showing a substructure of the embodiment of the invention.
Figure 9:
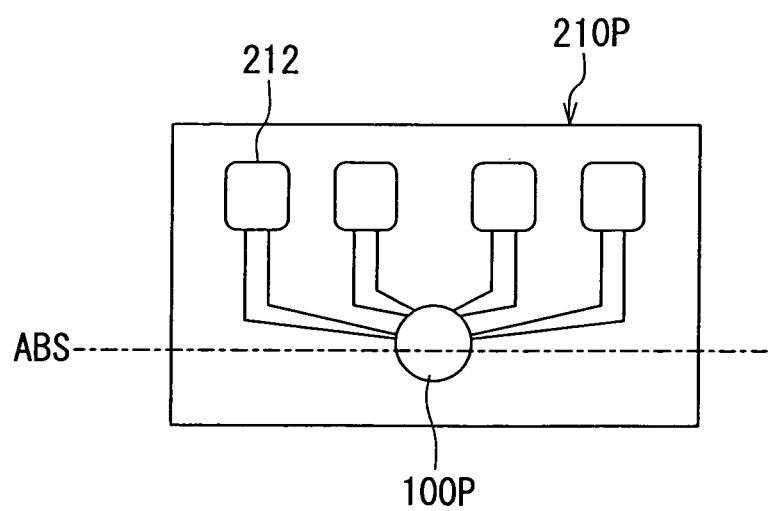
FIG. 9 is a plan view showing a pre-slider portion of the embodiment of the invention.

A method of manufacturing the magnetic head of the embodiment will now be outlined. In the method of manufacturing the magnetic head of the embodiment, a substructure 200 is fabricated by forming components of a plurality of magnetic heads other than the substrates on a single wafer including portions that later become the substrates 1 of the plurality of magnetic heads. The substructure 200 includes rows of a plurality of pre-slider portions 210P, the plurality of pre-slider portions 210P becoming individual sliders 210 later. FIG. 8 is a plan view of the substructure 200. FIG. 9 shows one of the pre-slider portions 210P included in the substructure 200. In FIG. 9 the region denoted by symbol 100P indicates a region where the read head unit and the write head unit of a magnetic head are disposed. The length of one side of the top surface of each pre-slider portion 210P is 1 mm or smaller, for example.

Next, the substructure 200 is cut into a slider assemblage that includes a row of pre-slider portions 210P. Then, the slider assemblage is subjected to polishing on a surface thereof that has been formed by cutting the substructure 200, whereby the medium facing surface 40 is formed for each pre-slider portion 210P included in the slider assemblage. In FIG. 9, the symbol "ABS" indicates the position at which the medium facing surface 40 is to be formed. The region 100P includes a portion to remain as the magnetic head (the portion located above the position ABS in FIG. 9) and a portion to be removed by polishing (the portion located below the position ABS in FIG. 9). Next, flying rails are formed in the medium facing surfaces 40. The slider assemblage is then cut so as to separate the plurality of pre-slider portions 210P from one another. This forms a plurality of sliders 210 including respective magnetic heads.

Now, a method of manufacturing the magnetoresistive device according to the embodiment, that is, the read head unit shown in FIG. 1, will be described. The following description includes the description of a method of manufacturing the micro-device according to the embodiment. The method of manufacturing the magnetoresistive device according to the embodiment includes the steps of forming the first electrode 3; forming a magnetoresistive film (hereinafter referred to as MR film) on the first electrode 3, the MR film becoming the MR element 5 later; and patterning the MR film so that the MR film is provided with at least part of the third surface of the MR element 5. The MR film has a top surface including a pre-second-surface portion that later becomes the second surface 5b of the MR element 5. The uppermost layer of the MR film is a metal layer that later becomes the protective layer 55. This metal layer is exposed in the pre-second-surface portion.

The method of manufacturing the magnetoresistive device according to the embodiment further includes the steps of forming the insulating portion from magnesium oxide such that the insulating portion is in contact with the at least part of the third surface having been formed in the step of patterning the MR film; removing an unwanted magnesium oxide film that has been formed on the pre-second-surface portion by the magnesium oxide in the step of forming the insulating portion; and forming the second electrode 8 after the step of removing the unwanted magnesium oxide film. The insulating portion includes the first insulating film 4A, the second insulating film 4B, and the insulating refill layer 7. In the step of forming the insulating portion, the magnesium oxide used to form the insulating portion adheres to the top surface of the MR film into the unwanted magnesium oxide film.

A method of etching a magnesium oxide film according to the embodiment is used in the step of removing the unwanted magnesium oxide film. The etching method includes the step of wet etching a magnesium oxide film that lies adjacent to a metal layer by using an etchant containing an aqueous ammonia solution.

The aforementioned etchant may further contain ammonium persulfate. In this case, the etchant has a pH preferably in the range of 9.0 to 10.0, and more preferably in the range of 9.3 to 9.6. The pH of the etchant can be controlled by changing the concentration of the aqueous ammonia solution, the amounts of the aqueous ammonia solution and ammonium persulfate, etc. The etchant having a pH in the range of 9.3 to 9.6 can be obtained by, for example, diluting 500 to 2,000 g of ammonium persulfate and about 500 mL of an aqueous ammonia solution containing 20% to 30% by weight of ammonia with pure water to prepare 40 L of an aqueous ammonium persulfate-ammonia mixed solution.

In the aforementioned etching method, the metal layer may contain one of Pt, Au, Ir, Ru, Rh, Pd, Ta, W, Zr, Nb, Mo, Mn, Fe, Ti, V, Si, Ge, Sn, Pr, Nd, Sm, Dy, Er, and NiCr. Alternatively, the metal layer may be made of a magnetic alloy such as FeNi, FeNiCo, or AlSiFe. The above-listed metal materials are significantly lower in etching rate than magnesium oxide when etched with the aforementioned etchant used in the etching method according to the embodiment. Thus, the etching method according to the embodiment makes it possible to selectively etch a magnesium oxide film adjacent to a metal layer by wet etching under the condition that the metal layer is not etched at all or is hardly etched.

It is because magnesium oxide dissolves in the aforementioned etchant that the etchant is capable of etching a magnesium oxide film. The reason why magnesium oxide dissolves in the aforementioned etchant is considered to be as follows. The etchant contains an aqueous ammonia solution. As shown by formula (1), ammonium ions $NH_4^+$ and hydroxide ions $OH^-$ are present in an aqueous ammonia solution. As shown by formula (2), magnesium oxide MgO dissolves in an aqueous ammonia solution because of the presence of ammonium ions $NH_4^+$. As shown by formula (3), magnesium ions $Mg^{2+}$ and hydroxide ions $OH^-$ produce magnesium hydroxide $Mg(OH)_2$, and as shown by formula (4), magnesium hydroxide $Mg(OH)_2$ also dissolves in an aqueous ammonia solution because of the presence of ammonium ions $NH_4^+$.

$$NH_3 + H_2O \rightarrow NH_4^+ + OH^- \quad (1)$$

$$MgO + 2NH_4^+ \rightarrow Mg^{2+} + 2NH_3 + H_2O \quad (2)$$

$$Mg^{2+} + 2OH^- \rightarrow Mg(OH)_2 \quad (3)$$

$$Mg(OH)_2 + 2NH_4^+ \rightarrow Mg^{2+} + 2NH_3 + 2H_2O \quad (4)$$

In the method of manufacturing the magnetoresistive device according to the embodiment, the unwanted magnesium oxide film formed on the pre-second-surface portion in the step of forming the insulating portion is located on the metal layer that later becomes the protective layer 55 of the MR element 5. Further, the unwanted magnesium oxide film is in contact with the metal layer of each of the first and second bias magnetic field applying layers 6A and 6B. Thus, the unwanted magnesium oxide film lies adjacent to these metal layers.

If the unwanted magnesium oxide film remains on the pre-second-surface portion, there may occur continuity failure between the MR element 5 and the second electrode 8. To prevent this, in the embodiment the aforementioned etching method is used to etch away the unwanted magnesium oxide film adjacent to the metal layers. According to the embodiment, the use of the aforementioned etching method allows the unwanted magnesium oxide film to be selectively etched by wet etching under the condition that the metal layers adjacent to the magnesium oxide film are not etched at all or are hardly etched.

Figure 10A:
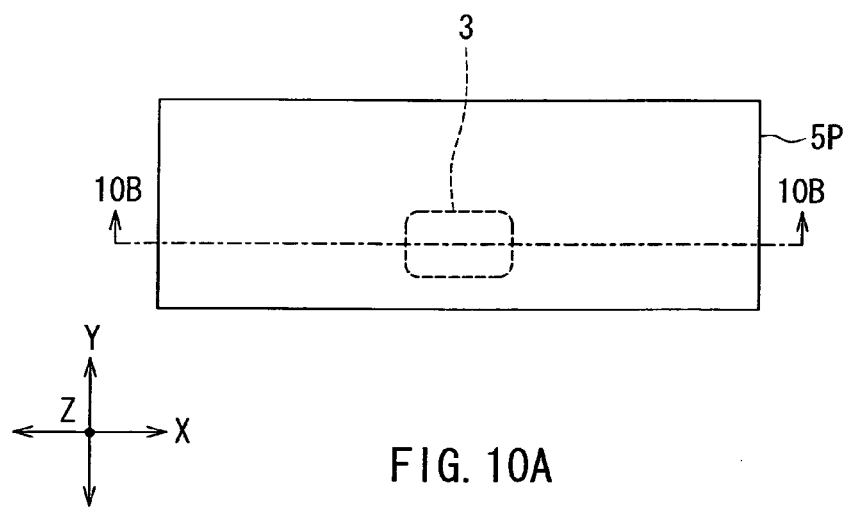
FIG. 10A and FIG. 10B are explanatory diagrams showing a step of a method of manufacturing the magnetoresistive device according to the embodiment of the invention.
Figure 10B:
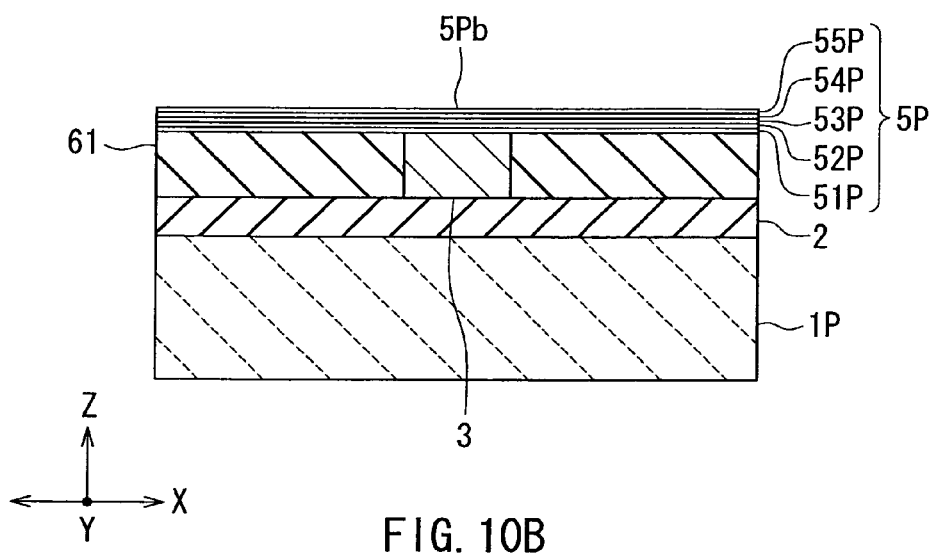

Now, the method of manufacturing the magnetoresistive device according to the embodiment will be specifically described with reference to FIG. 10A through FIG. 22C. FIG. 10A to FIG. 22A are plan views each showing a stack of layers formed in the process of manufacturing the magnetoresistive device. FIG. 10B to FIG. 22B are cross-sectional views showing cross sections taken along lines nB-nB (n is any integer from 10 to 22 inclusive) in FIG. 10A to FIG. 22A, respectively. FIG. 11C is a cross-sectional view showing a cross section taken along line 11C-11C in FIG. 11A. FIG. 22C is a cross-sectional view showing a cross section taken along line 22C-22C in FIG. 22A. FIG. 11B to FIG. 22B, FIG. 11C, and FIG. 22C omit portions located below the first electrode 3. In FIG. 17B to FIG. 21B and FIG. 22C, the symbol "ABS" indicates the position at which the medium facing surface 40 is to be formed.

In the method of manufacturing the magnetoresistive device, first, a single wafer including portions that later become the substrates 1 of a plurality of magnetic heads is prepared. Then, as previously mentioned, components of the plurality of magnetic heads other than the substrates are formed on the wafer. Now, the method of manufacturing the magnetoresistive device will be described with attention focused on a portion corresponding to a single magnetic head. In FIG. 10B, symbol 1P indicates the portion to become the substrate 1.

In the method of manufacturing the magnetoresistive device, the insulating layer 2 is formed on the wafer. Next, the first electrode 3 having a predetermined pattern is formed on the insulating layer 2 by plating, for example. Next, an insulating layer 61 is formed over the entire top surface of the stack. The insulating layer 61 is then polished by, for example, chemical mechanical polishing, until the first electrode 3 is exposed. Then, an MR film 5P, which later becomes the MR element 5, is formed over the first electrode 3 and the insulating layer 61. FIG. 10A and FIG. 10B show the stack after the MR film 5P has been formed.

The MR film 5P is formed of a stack of five layers 51P, 52P, 53P, 54P, and 55P that later become the antiferromagnetic layer 51, the pinned layer 52, the magnesium oxide layer 53, the free layer 54, and the protective layer 55, respectively. The layers 51P to 55P are formed in this order on the first electrode 3 and the insulating layer 61. The total thickness of the layers 51P to 55P is in the range of 20 to 30 nm, for example. The layer 55P is a metal layer made of nonmagnetic metal. The MR film 5P has a top surface 5Pb including a pre-secondsurface portion 5Pb1 that later becomes the second surface 5b. The top surface 5Pb is formed by the top surface of the metal layer 55P. The pre-second-surface portion 5Pb1 is not shown in FIG. 10B but is shown in other figures to be referred to in later descriptions.

Figure 11A:
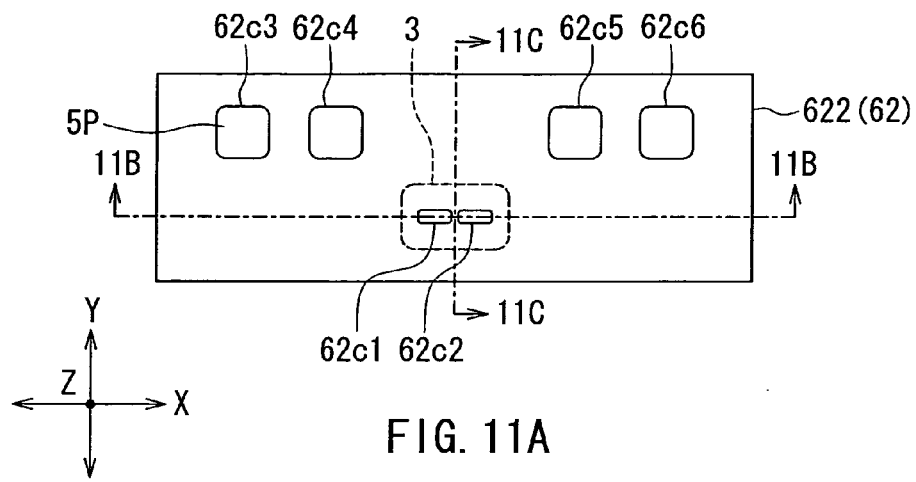
FIG. 11A to FIG. 11C are explanatory diagrams showing a step that follows the step shown in FIG. 10A and FIG. 10B.
Figure 11B:
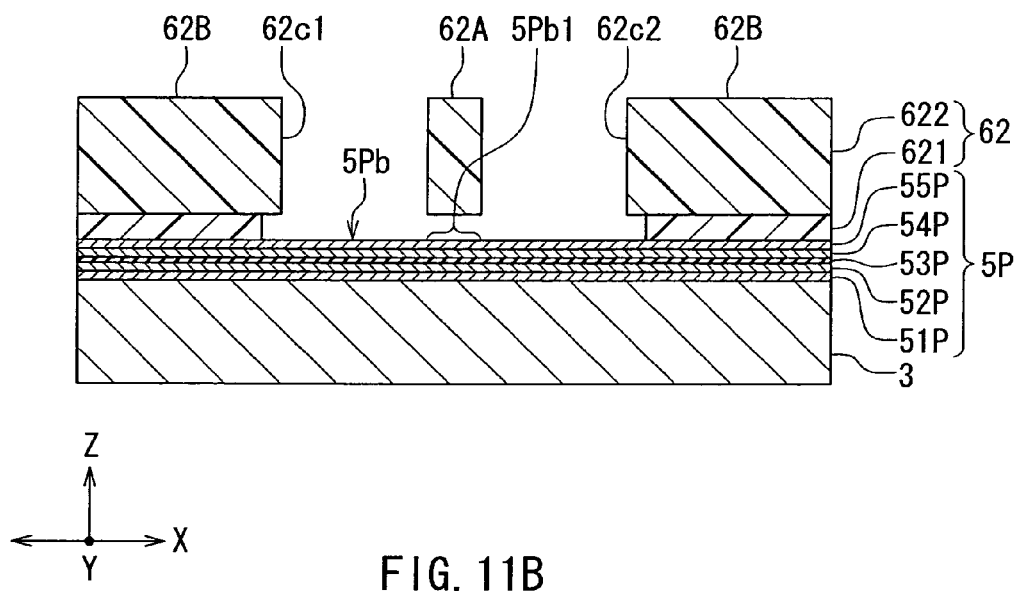
Figure 11C:
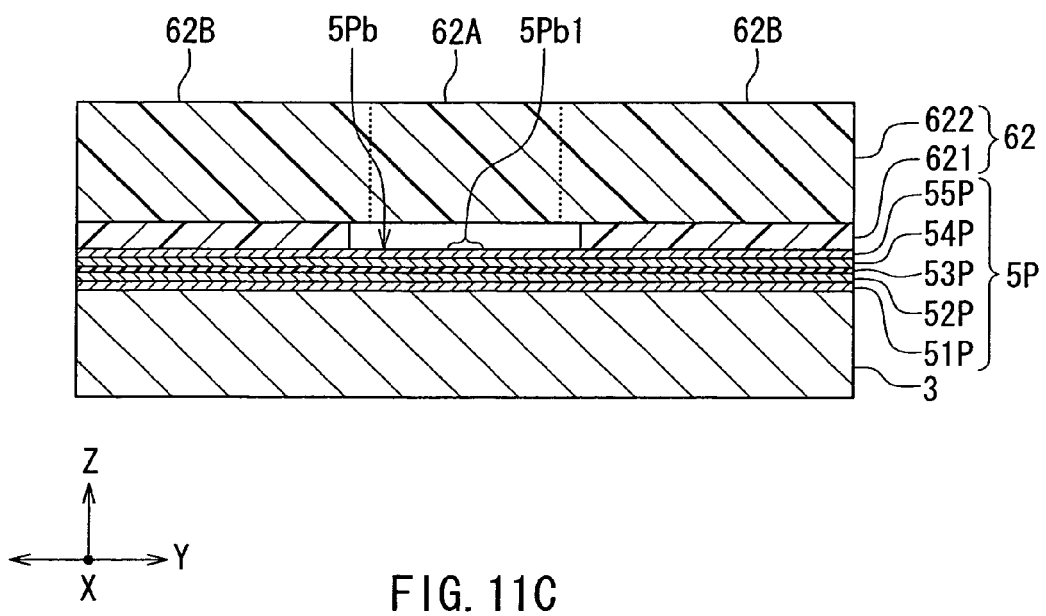

FIG. 11A to FIG. 11C show the next step. The pre-second-surface portion 5Pb1 is shown in FIG. 11B and FIG. 11C. In this step, first, an etching mask 62 is formed on the MR film 5P. The etching mask 62 includes a lower layer 621 and an upper layer 622. The upper layer 622 is formed of a photoresist patterned by photolithography. The lower layer 621 is formed of, for example, a material that dissolves in a developing solution that is used in patterning the upper layer 622. An example of such a material is polydimethylglutarimide (PMGI). The lower layer 621 has a thickness in the range of 35 to 50 nm, for example. The upper layer 622 has a thickness in the range of 100 to 200 nm, for example.

The etching mask 62 includes a first portion 62A located above the pre-second-surface portion 5Pb1 of the MR film 5P, and a second portion 62B that is in contact with a part of the top surface 5Pb of the MR film 5P other than the pre-second-surface portion 5Pb1 and supports the first portion 62A. In FIG. 11C the boundaries between the first portion 62A and the second portion 62B are indicated by dotted lines. The first portion 62A has a planar shape (shape in a plan view) corresponding to the planar shape of the MR element 5 to be formed later. The first portion 62A is formed of part of the upper layer 622, and the lower layer 621 is not present between the first portion 62A and the MR film 5P. The first portion 62A thus lies in a floating state above the top surface 5Pb of the MR film 5P. The first portion 62A is formed by removing the lower layer 621 present under a portion of the upper layer 622 that later becomes the first portion 62A, when patterning the upper layer 622. The first portion 62A has a width in the X direction of 30 to 100 nm, for example. The width in the X direction of the first portion 62A defines the width in the track width direction (the X direction) of the MR element 5 to be formed later.

As shown in FIG. 11B, the second portion 62B has an undercut. The difference in level between a wall face of the lower layer 621 and a wall face of the upper layer 622 that face toward the same direction, that is, the size of the undercut, falls within the range of 30 to 100 nm, for example, and preferably within the range of 30 to 40 nm.

Further, as shown in FIG. 11A, the etching mask 62 has openings 62c1, 62c2, 62c3, 62c4, 62c5, and 62c6 for exposing portions of the top surface 5Pb of the MR film 5P. The openings 62c1 and 62c2 are adjacent to opposite sides of the first portion 62A in the X direction. The openings 62c3 to 62c6 are apart from the openings 62c1 and 62c2, and are aligned in the X direction. The opening 62c1 has a shape corresponding to the planar shape of the first bias magnetic field applying layer 6A to be formed later. The opening 62c2 has a shape corresponding to the planar shape of the second bias magnetic field applying layer 6B to be formed later.

Figure 12A:
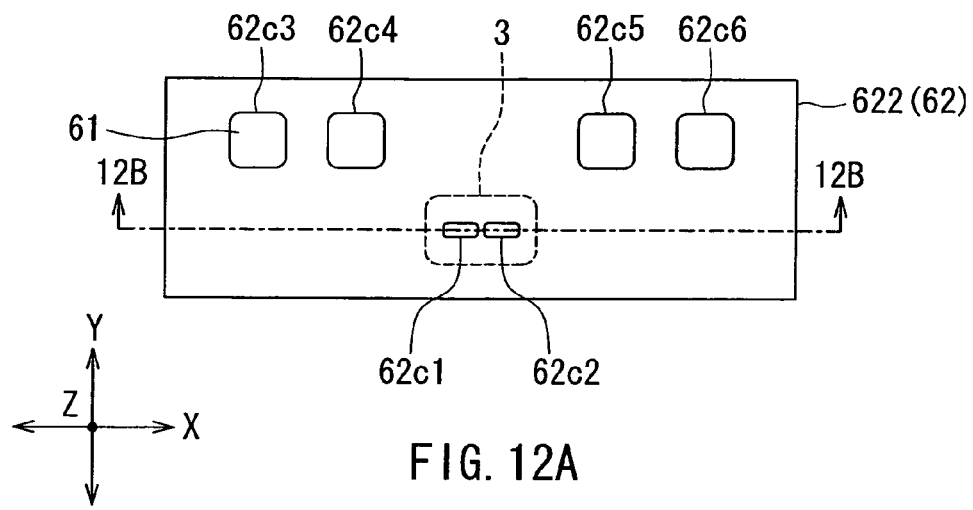
FIG. 12A and FIG. 12B are explanatory diagrams showing a step that follows the step shown in FIG. 11A to FIG. 11C.
Figure 12B:
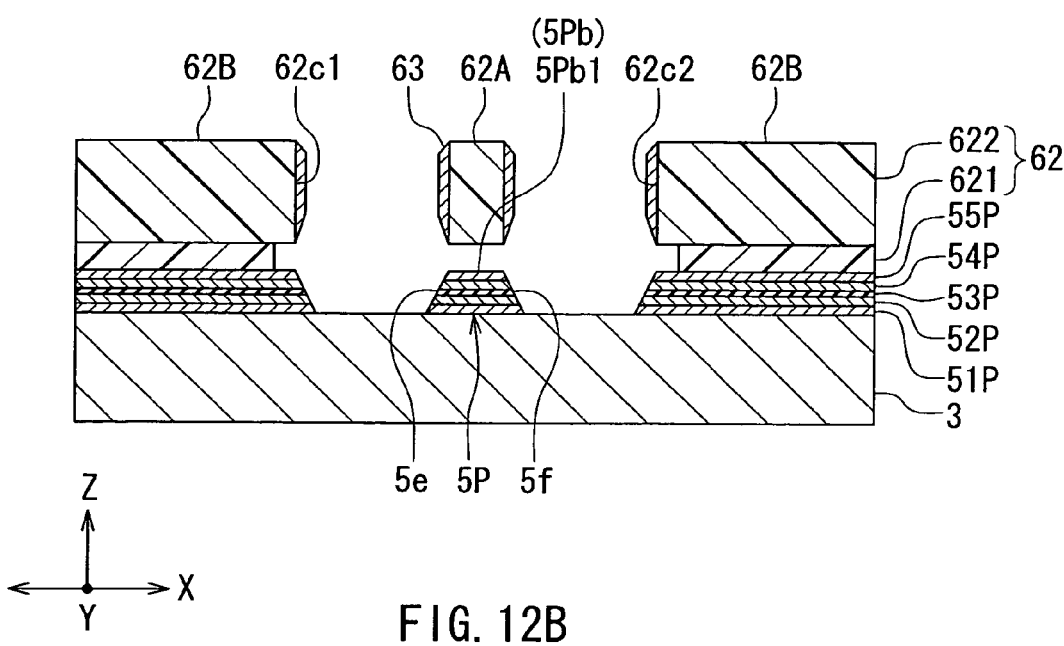

FIG. 12A and FIG. 12B show the next step. In this step, the MR film 5P is dry etched using the etching mask 62 to thereby provide the MR film 62 with the first and second side surfaces 5e and 5f, which are part of the third surface of the MR element 5. This etching is performed by, for example, ion milling, until the top surface of the first electrode 3 and the top surface of the insulating layer 61 are exposed. During this etching, flying substances generated by the etching of the MR film 5P adhere to the sidewalls of the upper layer 622 constituting the sidewalls of the openings 62c1 to 62c6, and thereby form adhesion films 63.

When the MR film 5P is etched by ion milling, measurement is performed to identify elements flying from the MR film 5P during the etching, and the measurement results are used to control the level at which the etching is to be stopped. More specifically, using an ion milling device equipped with an element analyzer for analyzing elements by secondary ion mass spectrometry (SIMS), for example, a portion from the layer 55P to the layer 51P is etched while performing the measurement for identifying the flying elements generated during the etching, and the etching is stopped when the elements forming the layer 51P are no longer detected. The openings 62c3 to 62c6 of the etching mask 62 are provided to detect the flying elements generated during the etching.

The step of forming the etching mask 62 and the step of dry etching the MR film 5P using the etching mask 62 to provide the MR film 5P with the first and second side surfaces 5e and 5f correspond to the step of patterning the MR film in the method of manufacturing the magnetoresistive device of the present invention.

Figure 13A:
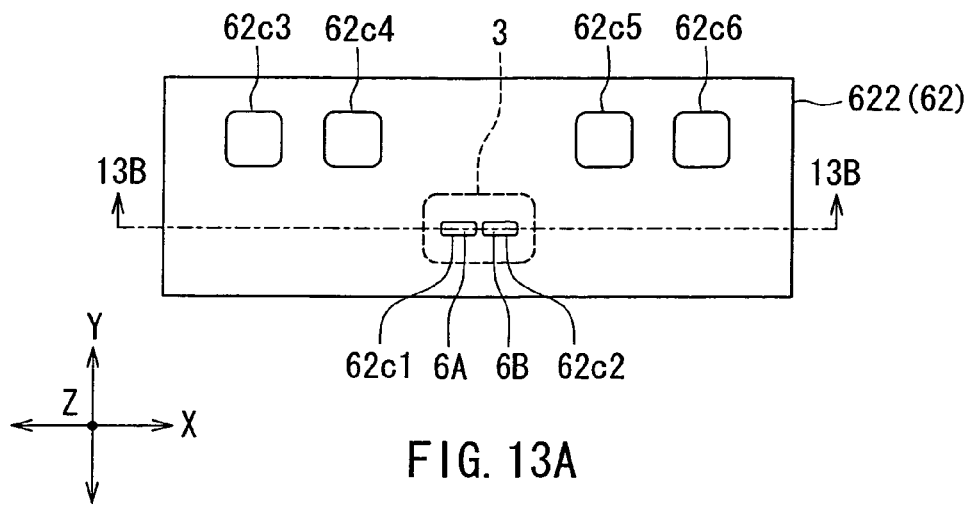
FIG. 13A and FIG. 13B are explanatory diagrams showing a step that follows the step shown in FIG. 12A and FIG. 12B.
Figure 13B:
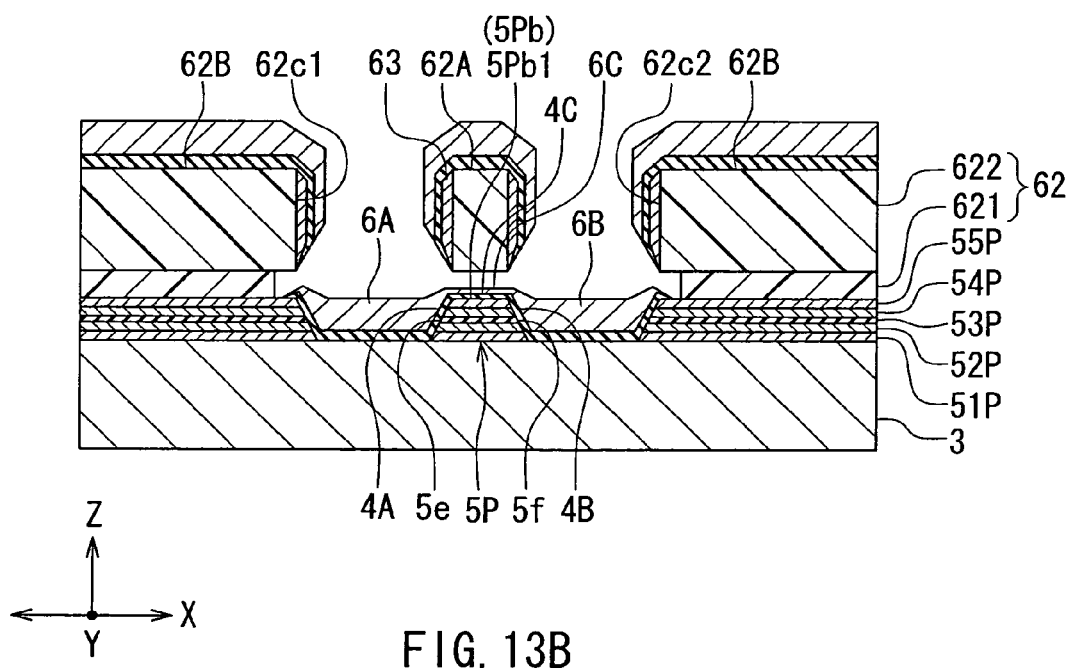

FIG. 13A and FIG. 13B show the next step. In this step, first, the first and second insulating films 4A and 4B are formed from magnesium oxide. The first and second insulating films 4A and 4B are formed by physical vapor deposition, such as sputtering, with the etching mask 62 left unremoved. The first insulating film 4A is formed to be in contact with the first side surface 5e, and the second insulating film 4B is formed to be in contact with the second side surface 5f. The step of forming the insulating films 4A and 4B corresponds to the step of forming the insulating portion in the method of manufacturing the magnetoresistive device of the present invention. In this step, magnesium oxide used to form the insulating films 4A and 4B adheres onto the pre-second-surface portion 5Pb1 of the MR film 5P which is not in contact with the etching mask 62, and thereby forms an unwanted magnesium oxide film 4C on the pre-second-surface portion 5Pb1. The magnesium oxide adheres also to the etching mask 62. When the insulating films 4A and 4B are formed, the pre-second-surface portion 5Pb1 is shaded by the etching mask 62. This makes the unwanted magnesium oxide film 4C smaller in thickness than the insulating films 4A and 4B.

Next, the first bias magnetic field applying layer 6A is formed on the insulating film 4A and the second bias magnetic field applying layer 6B is formed on the insulating film 4B by, for example, sputtering, with the etching mask 62 left unremoved. At this time, the material for forming the bias magnetic field applying layers 6A and 6B adheres onto the unwanted magnesium oxide film 4C and thereby forms an unwanted film 6C. The material for forming the bias magnetic field applying layers 6A and 6B adheres also to the etching mask 62. When the bias magnetic field applying layers 6A and 6B are formed, the top surface of the unwanted magnesium oxide film 4C is shaded by the etching mask 62. This makes the unwanted film 6C smaller in thickness than the bias magnetic field applying layers 6A and 6B.

Figure 14A:
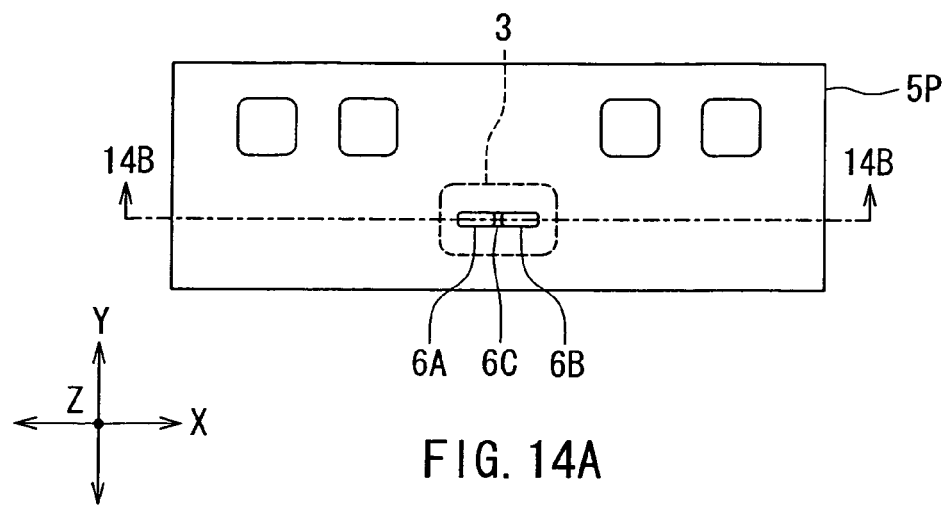
FIG. 14A and FIG. 14B are explanatory diagrams showing a step that follows the step shown in FIG. 13A and FIG. 13B.
Figure 14B:
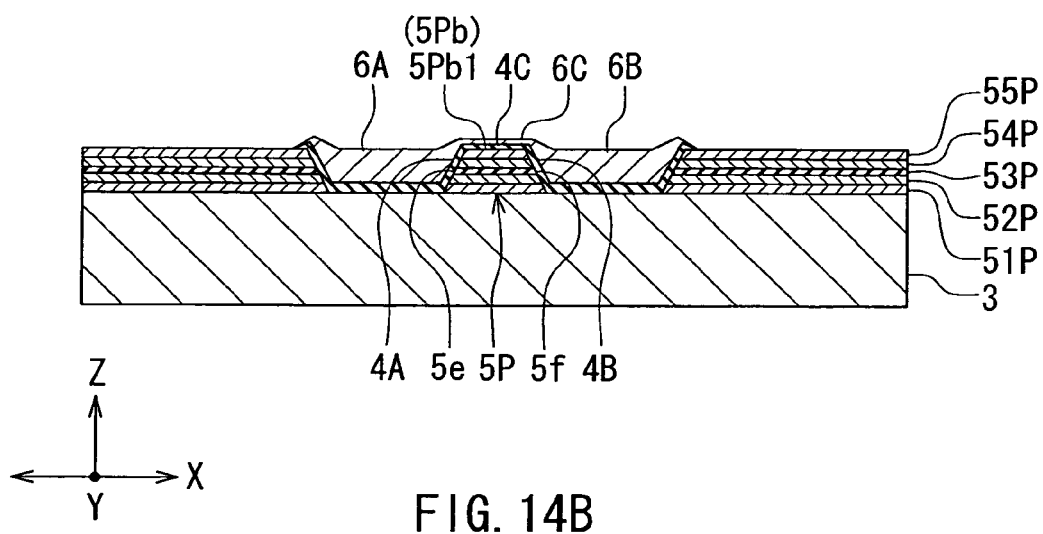

FIG. 14A and FIG. 14B show the next step. In this step, the etching mask 62 is removed using an organic solvent, for example. This also removes the materials adhering to the etching mask 62.

Figure 15A:
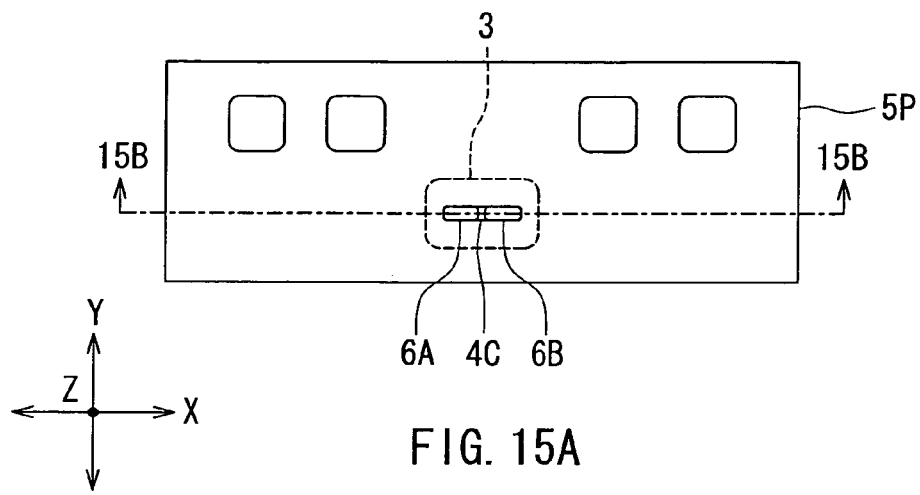
FIG. 15A and FIG. 15B are explanatory diagrams showing a step that follows the step shown in FIG. 14A and FIG. 14B.
Figure 15B:
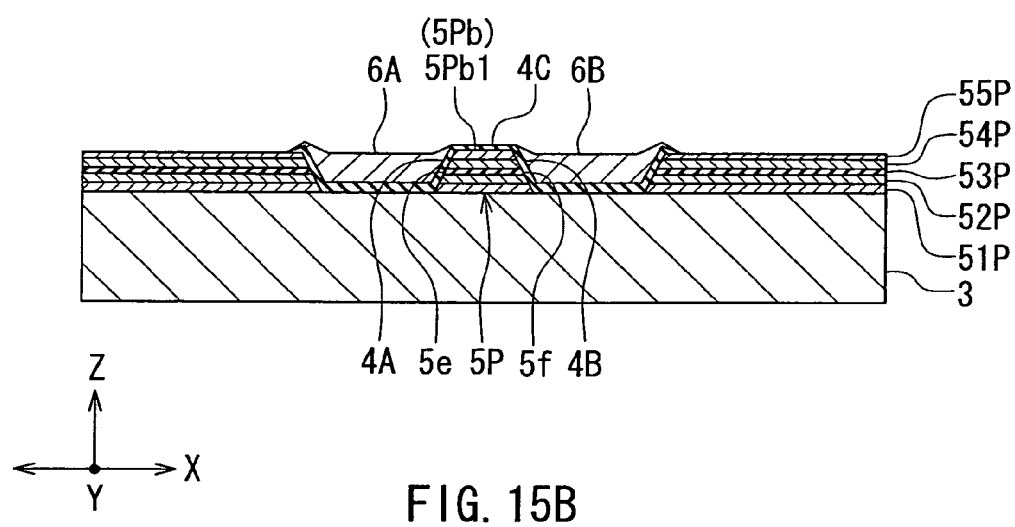

FIG. 15A and FIG. 15B show the next step. In this step, the unwanted film 6C is etched by, for example, ion milling, so that the unwanted magnesium oxide film 4C is exposed.

Figure 16A:
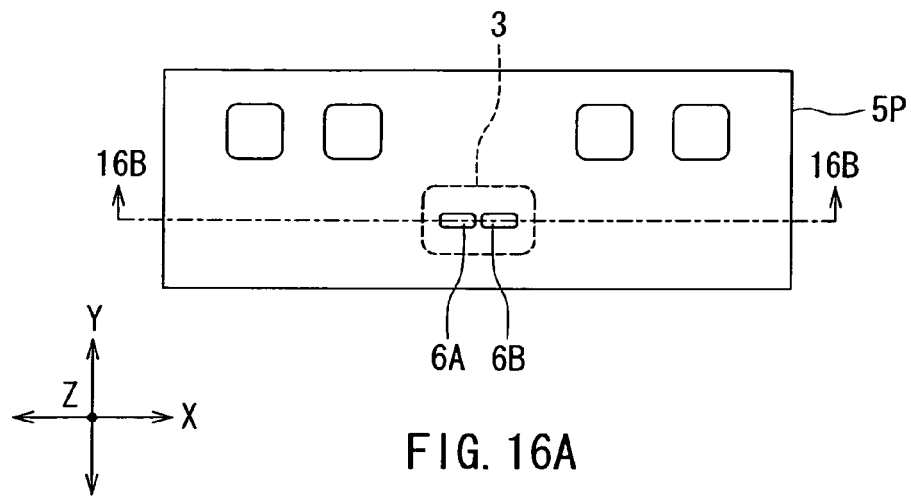
FIG. 16A and FIG. 16B are explanatory diagrams showing a step that follows the step shown in FIG. 15A and FIG. 15B.
Figure 16B:
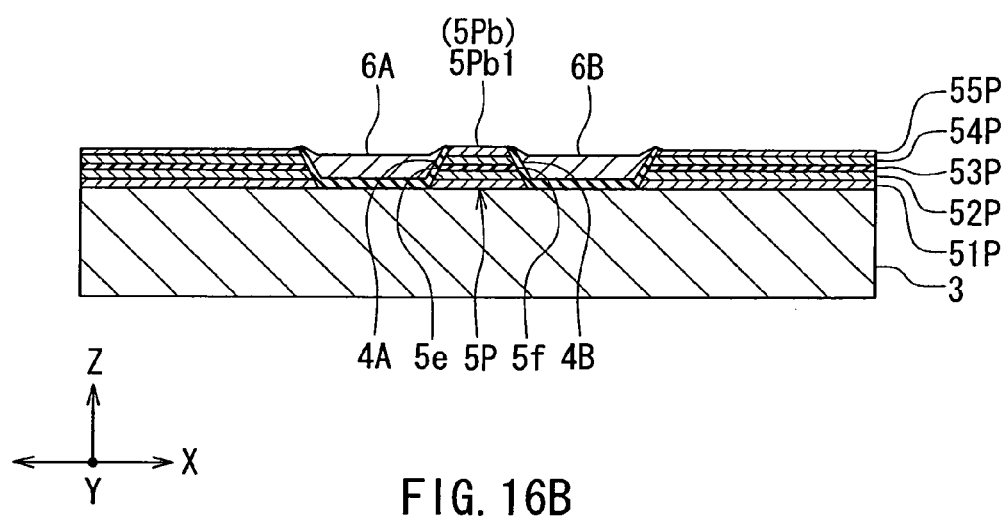

FIG. 16A and FIG. 16B show the next step. In this step, the unwanted magnesium oxide film 4C is removed by using the method of etching a magnesium oxide film according to the embodiment. More specifically, the unwanted magnesium oxide film 4C is wet etched by using the etchant containing an aqueous ammonium solution. The etching is performed for a duration of about 60 seconds, for example. Before being etched, the unwanted magnesium oxide film 4C is adjacent to the metal layer 55P and the metal layer of each of the bias magnetic field applying layers 6A and 6B. During this etching, those metal layers are not etched at all or are hardly etched while the unwanted magnesium oxide film 4C is selectively etched.

Figure 17A:
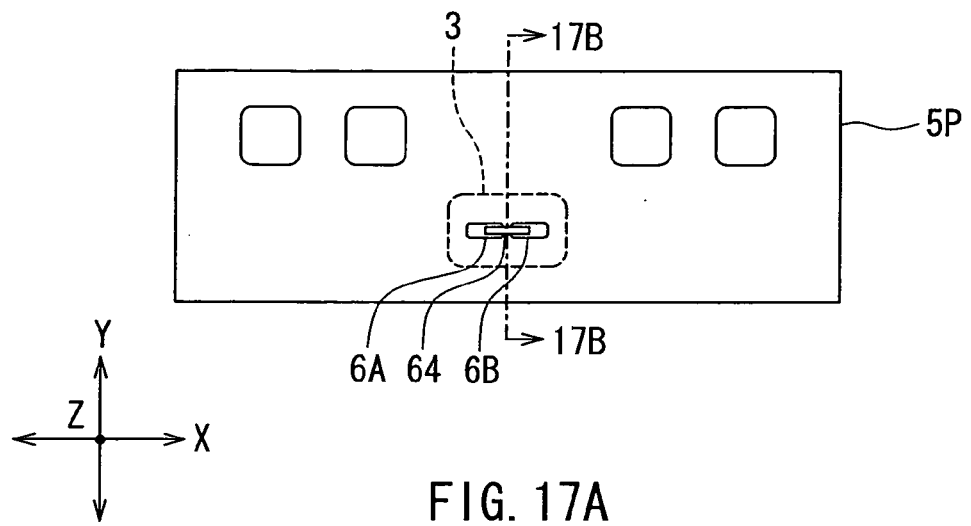
FIG. 17A and FIG. 17B are explanatory diagrams showing a step that follows the step shown in FIG. 16A and FIG. 16B.
Figure 17B:
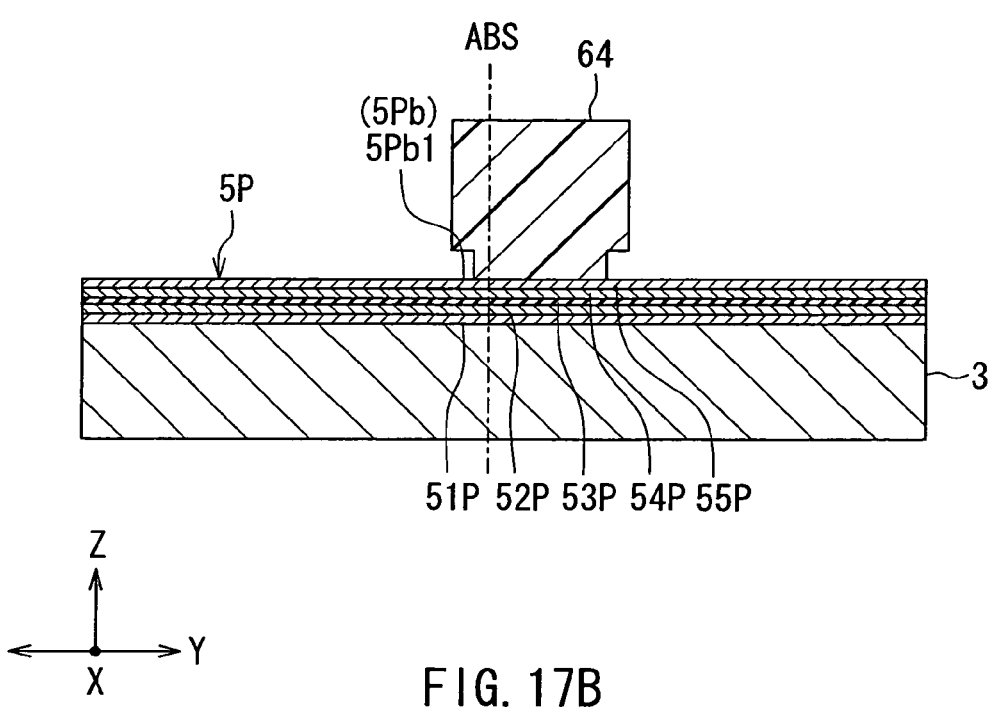

FIG. 17A and FIG. 17B show the next step. In this step, an etching mask 64 for defining the position of the rear end face 5d of the MR element 5 is formed on a region of the top surface 5Pb of the MR film 5P including the pre-second-surface portion 5Pb1. As shown in FIG. 17B, the etching mask 64 has an undercut. Thus, the etching mask 64 is not in contact with part of the pre-second-surface portion 5Pb1. The etching mask 64 may consist of a lower layer and an upper layer like the etching mask 62 shown in FIG. 11B.

In the stack shown in FIG. 17B, a portion on the left side of the position ABS at which the medium facing surface 40 is to be formed will remain as the magnetic head, and a portion on the right side of the position ABS will be removed by polishing when the medium facing surface 40 is formed. As shown in FIG. 17B, the etching mask 64 is disposed to extend over the portion that will remain as the magnetic head and the portion that will be removed by polishing.

Figure 18A:
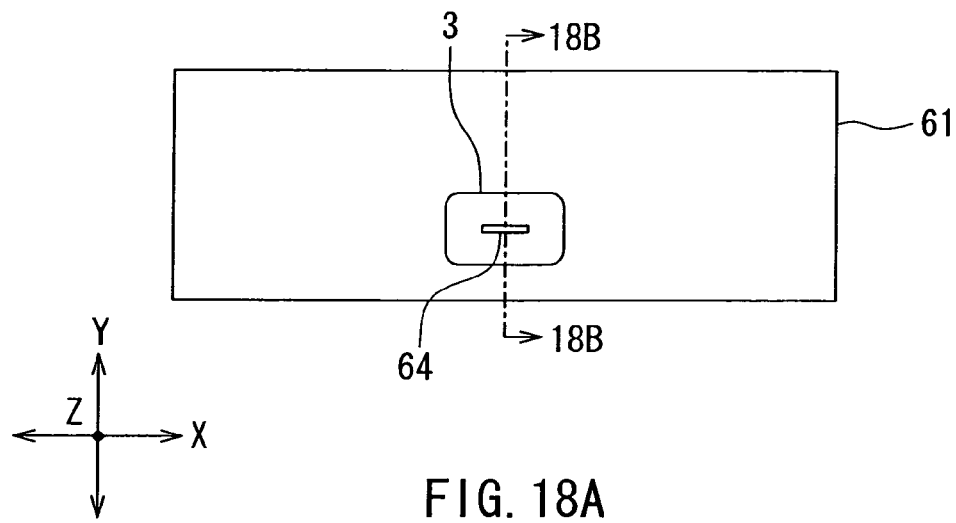
FIG. 18A and FIG. 18B are explanatory diagrams showing a step that follows the step shown in FIG. 17A and FIG. 17B.
Figure 18B:
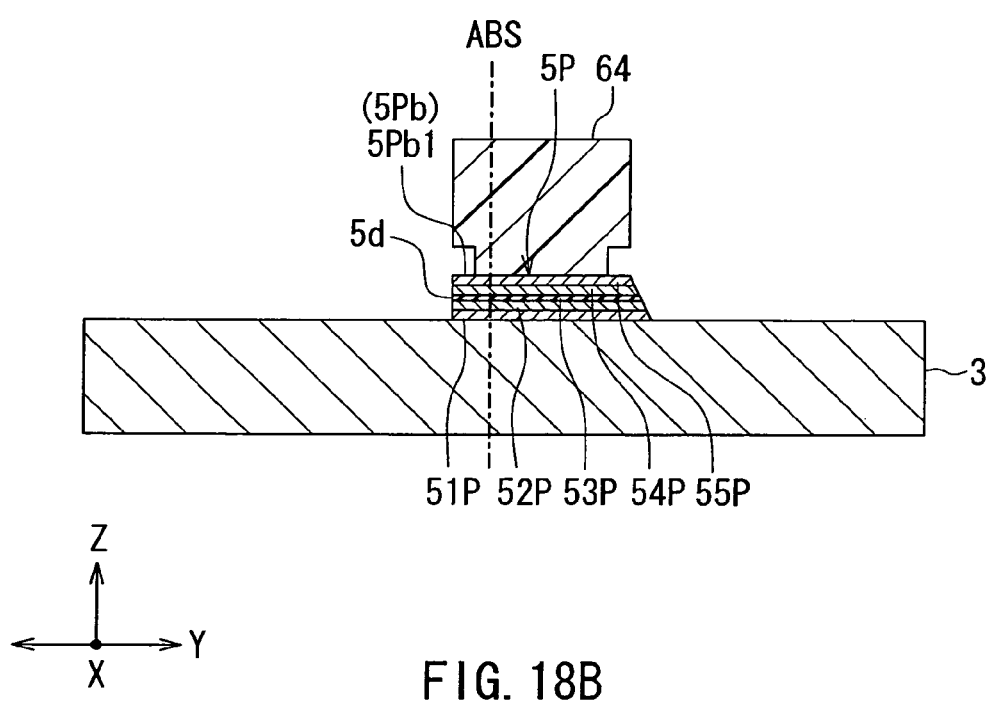

FIG. 18A and FIG. 18B show the next step. In this step, the MR film 5P and the bias magnetic field applying layers 6A and 6B are dry etched using the etching mask 64 to thereby provide the MR film 5P with the rear end face 5d, a part of the third surface. For example, the rear end face 5d is at a distance of 20 to 50 nm from the position ABS. The etching in this step is performed by ion milling, for example.

The step of forming the etching mask 64 and the step of dry etching the MR film 5P using the etching mask 64 to provide the MR film 5P with the rear end face 5d correspond to the step of patterning the MR film in the method of manufacturing the magnetoresistive device of the present invention.

Figure 19A:
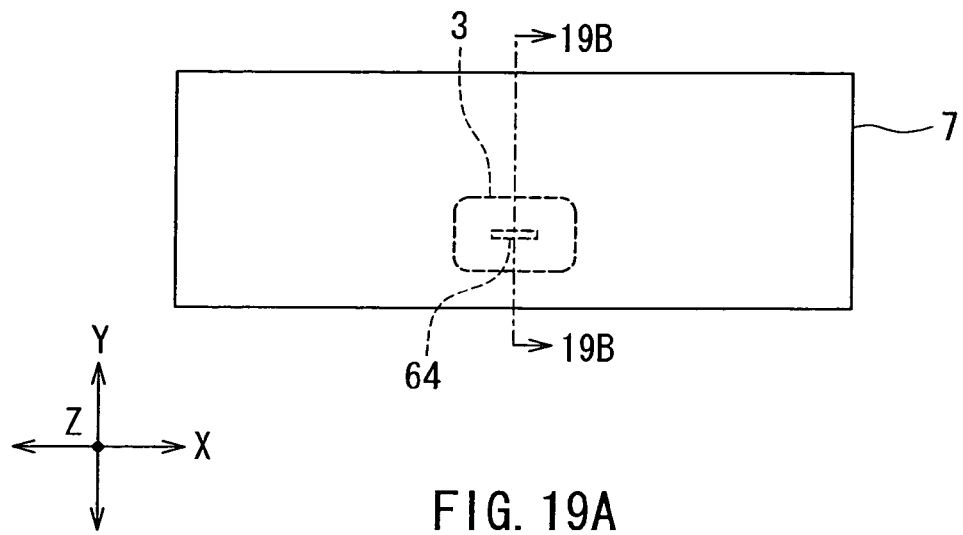
FIG. 19A and FIG. 19B are explanatory diagrams showing a step that follows the step shown in FIG. 18A and FIG. 18B.
Figure 19B:
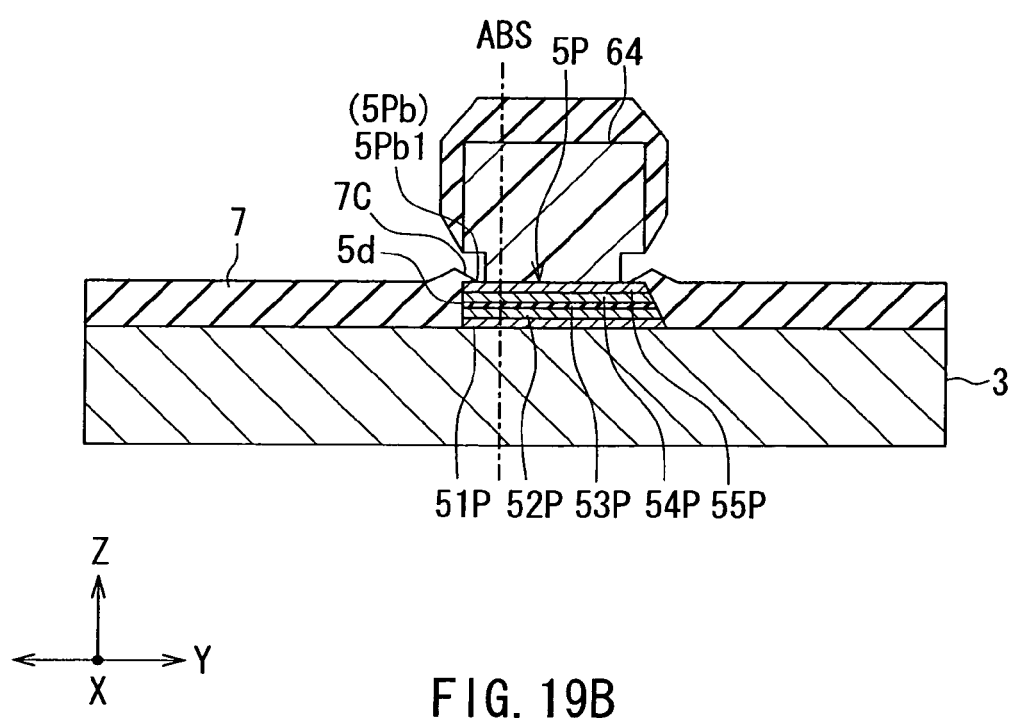

FIG. 19A and FIG. 19B show the next step. In this step, the insulating refill layer 7 is formed from magnesium oxide so as to be in contact with the rear end face 5d. The insulating refill layer 7 is formed by physical vapor deposition, such as sputtering, with the etching mask 64 left unremoved. The step of forming the insulating refill layer 7 corresponds to the step of forming the insulating portion in the method of manufacturing the magnetoresistive device of the present invention. In this step, magnesium oxide used to form the insulating refill layer 7 deposits also on the part of the pre-second-surface portion 5Pb1 of the MR film 5P that is not in contact with the etching mask 64, thereby forming an unwanted magnesium oxide film 7C on the pre-second-surface portion 5Pb1.

Figure 20A:
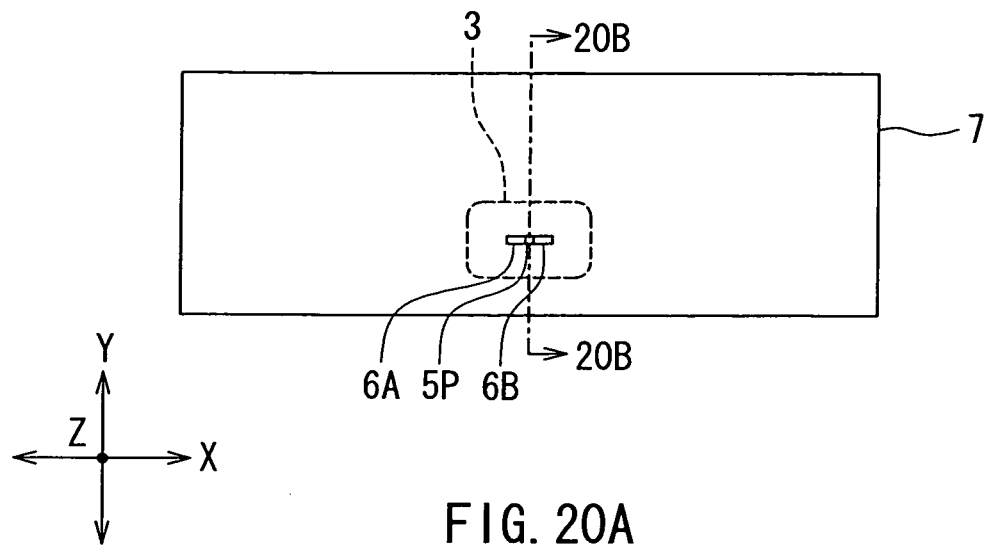
FIG. 20A and FIG. 20B are explanatory diagrams showing a step that follows the step shown in FIG. 19A and FIG. 19B.
Figure 20B:
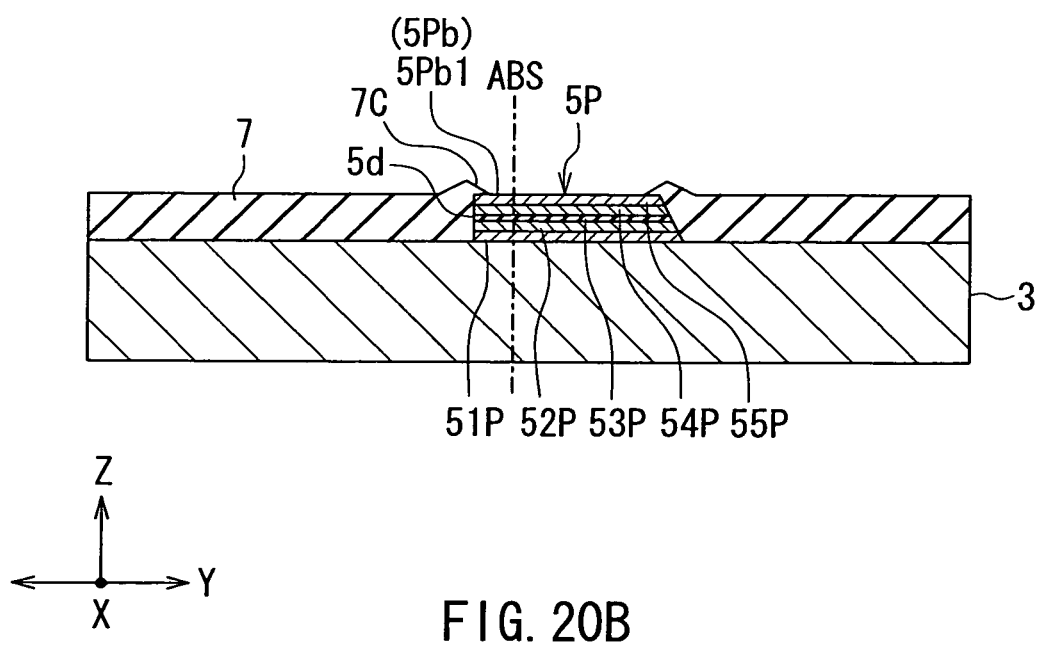

FIG. 20A and FIG. 20B show the next step. In this step, the etching mask 64 is removed using an organic solvent, for example.

Figure 21A:
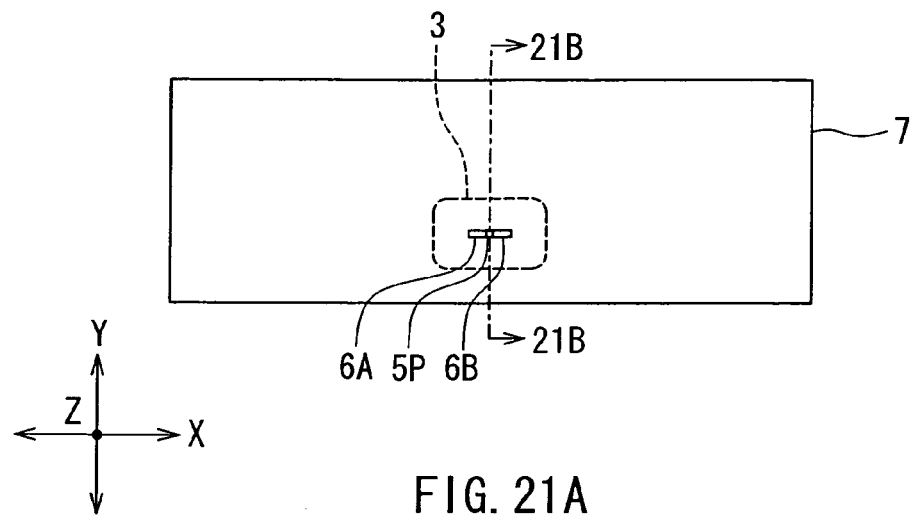
FIG. 21A and FIG. 21B are explanatory diagrams showing a step that follows the step shown in FIG. 20A and FIG. 20B.
Figure 21B:
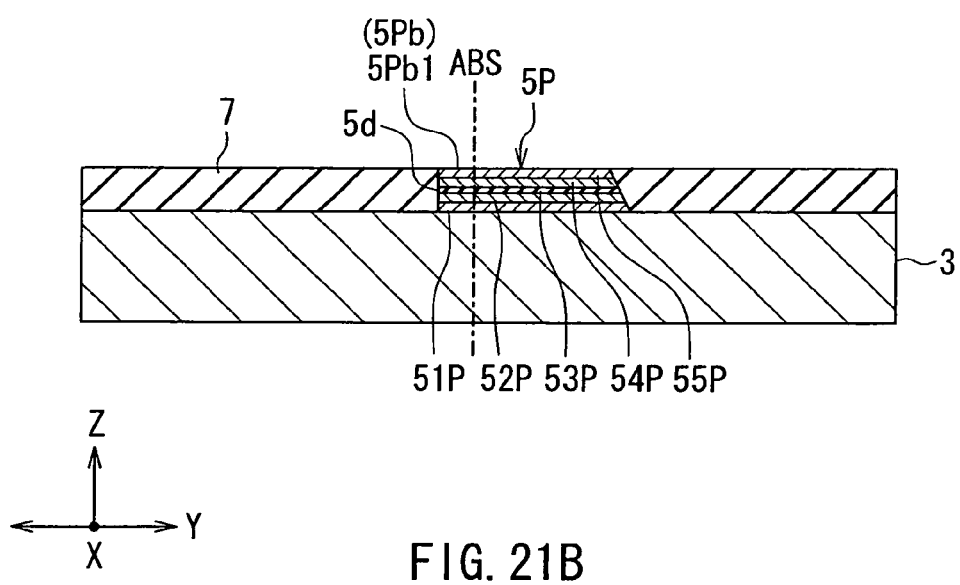

FIG. 21A and FIG. 21B show the next step. In this step, the unwanted magnesium oxide film 7C on the pre-second-surface portion 5Pb1 is removed by using the method of etching a magnesium oxide film according to the embodiment. More specifically, the unwanted magnesium oxide film 7C is wet etched by using the etchant containing an aqueous ammonium solution. This etching is performed for a duration of about 60 seconds, for example. Before being etched, the unwanted magnesium oxide film 7C is adjacent to the metal layer 55P and the metal layer of each of the bias magnetic field applying layers 6A and 6B. During this etching, those metal layers are not etched at all or are hardly etched while the unwanted magnesium oxide film 7C is selectively etched.

Figure 22A:
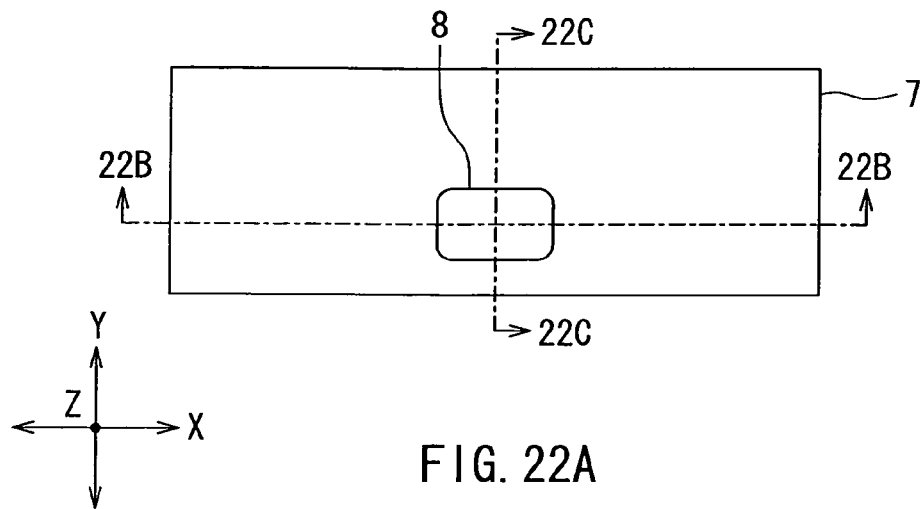
FIG. 22A to FIG. 22C are explanatory diagrams showing a step that follows the step shown in FIG. 21A and FIG. 21B.
Figure 22B:
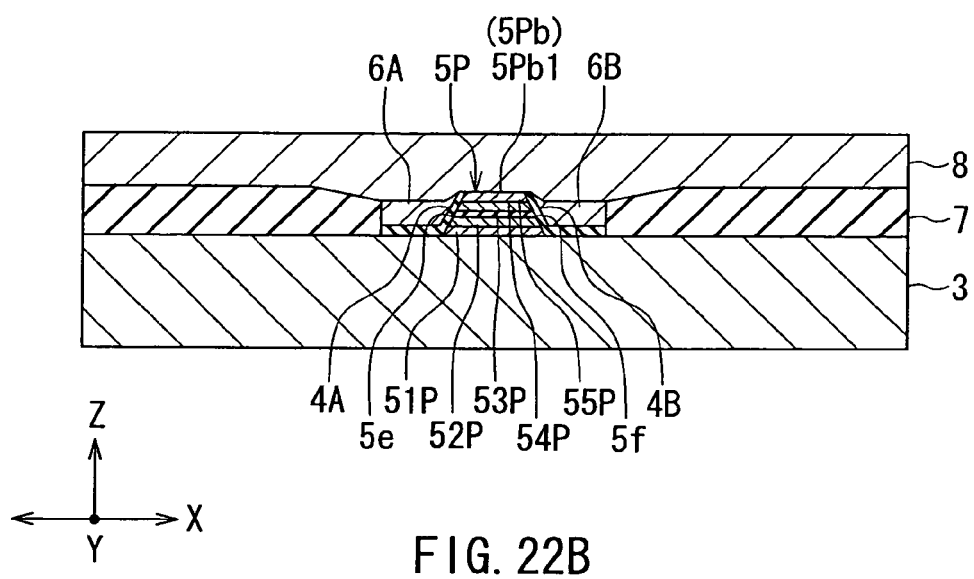
Figure 22C:
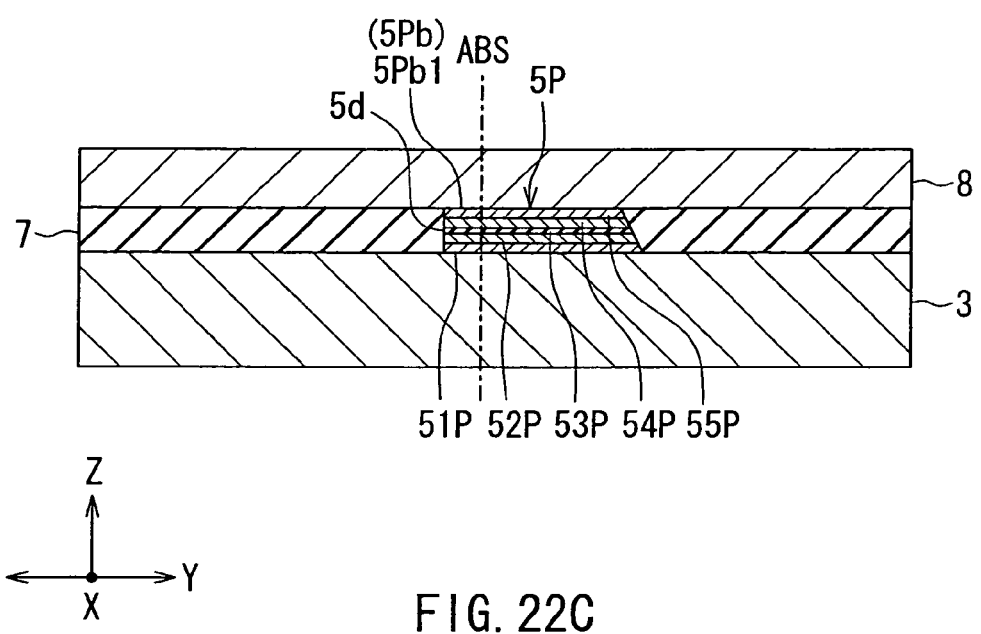

FIG. 22A to FIG. 22C show the next step. In this step, first, a mask that is not illustrated and has an opening of the shape corresponding to the planar shape of the second electrode 8 is formed by photolithography. Then, the second electrode 8 is formed in the opening of the mask by plating, for example. The mask is then removed.

In the method of manufacturing the magnetic head, the remaining components of magnetic heads are formed on the stack shown in FIG. 22A to FIG. 22C to thereby fabricate the substructure 200 shown in FIG. 8. Further, the substructure 200 is cut into the slider assemblage, and the slider assemblage is subjected to polishing on a surface thereof that has been formed by cutting the substructure 200, whereby the medium facing surface 40 is formed for each pre-slider portion 210P included in the slider assemblage. The formation of the medium facing surface 40 provides the MR film 5P with the front end face 5c, and the MR film 5P thereby becomes MR element 5. The magnetoresistive device is completed through a series of steps described above.

Now, a description will be given of experimental results demonstrating the effects of the method of etching a magnesium oxide film according to the embodiment.

[First Experiment]

The results of a first experiment will be described first. The first experiment was performed to confirm that an etchant consisting of an aqueous ammonia solution was able to etch a magnesium oxide film. Used in the first experiment was a sample formed by depositing a 30 nm-thick magnesium oxide film on a Si substrate by sputtering. The magnesium oxide film of this sample was wet etched using an etchant consisting of an aqueous ammonia solution. Two different etching durations of 2 minutes and 5 minutes were employed. The etchant was obtained by diluting 500 mL of an aqueous ammonia solution containing 28% by weight of ammonia with pure water to prepare 40 L of an aqueous ammonia solution. The pH of the etchant was 10.4. The procedure of etching was as follows. The sample and the etchant were placed in a beaker and left to stand at rest for a predetermined period of time. Then, the sample was removed from the beaker, washed with running pure water for 1 minute, and dried.

Figure 23:
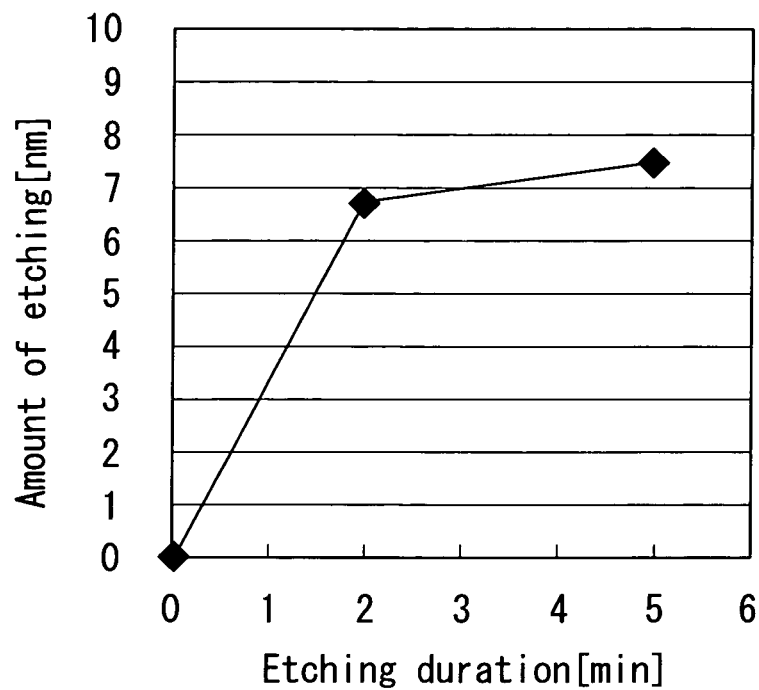
FIG. 23 is a characteristic diagram showing the results of a first experiment.

FIG. 23 shows the results of the first experiment. In FIG. 23, the horizontal axis represents etching duration, and the vertical axis represents the amount of etching of the magnesium oxide film. In the first experiment, the amount of reduction in the thickness of the magnesium oxide film due to the etching was defined as the amount of etching of the magnesium oxide film. This definition is used also for the amount of etching of any of films used in the following description. In the first experiment, the amount of etching of the magnesium oxide film was 6.7 nm when the etching duration was 2 minutes and 7.5 nm when the etching duration was 5 minutes. These results show that the use of an etchant containing at least an aqueous ammonia solution allows a magnesium oxide film to be sufficiently etched.

However, as can be seen from FIG. 23, when a magnesium oxide film is wet etched using an etchant consisting of an aqueous ammonia solution, the change in the amount of etching of the magnesium oxide film versus time is not linear, and the etching rate decreases with increasing etching duration. In this case, it is difficult to control the amount of etching using the etching duration as a parameter. To address this problem, attempts were made to add additives to aqueous ammonia solutions in order to obtain an etchant that could make the change in the amount of etching of a magnesium oxide film versus time linear. Then, ammonium persulfate was found to be an effective additive. This is shown below as the results of a second experiment.

[Second Experiment]

In the second experiment, the magnesium oxide film in the sample used in the first experiment was wet etched using an etchant prepared by adding ammonium persulfate to an aqueous ammonia solution. The etchant was obtained by diluting 1,800 g of ammonium persulfate and 500 mL of an aqueous ammonia solution containing 28% by weight of ammonia with pure water to prepare 40 L of an aqueous ammonium persulfate-ammonia mixed solution. The pH of the etchant was 9.6. The etching procedure was the same as that in the first experiment.

For the second experiment, in addition to the sample used in the first experiment, another sample was prepared which was formed by depositing a 30 nm-thick alumina film on a Si substrate by sputtering. The alumina film in this sample was also wet etched using the aforementioned etchant. Three different etching durations of 1 minute, 3 minutes, and 10 minutes were employed.

Figure 24:
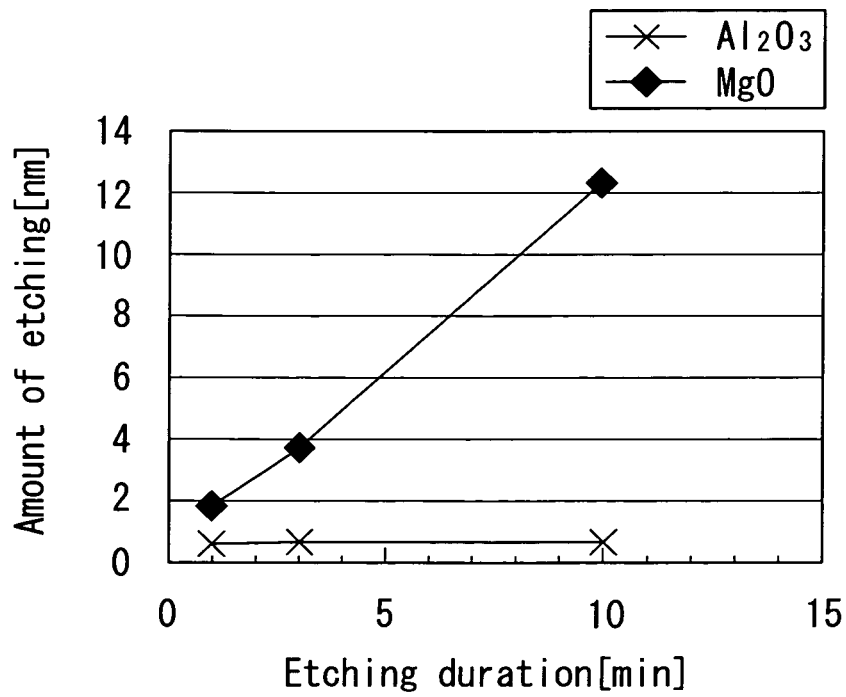
FIG. 24 is a characteristic diagram showing the results of a second experiment.

FIG. 24 shows the results of the second experiment. In FIG. 24, the horizontal axis represents etching duration, and the vertical axis represents the amount of etching of the magnesium oxide film or the alumina film. In FIG. 24, the points and line denoted by symbol "MgO" indicate the amount of etching of the magnesium oxide film, and the points and line denoted by symbol "$Al_2O_3$" indicate the amount of etching of the alumina film.

The results of the second experiment were that the amounts of etching of the magnesium oxide film for etching durations of 1 minute, 3 minutes, and 10 minutes were 1.82 nm, 3.75 nm, and 12.31 nm, respectively. These results indicate that the use of an etchant comprising an aqueous ammonium persulfate-ammonia mixed solution allows a magnesium oxide film to be sufficiently etched and also allows the change in the amount of etching of the magnesium oxide film versus time to be linear.

On the other hand, the amounts of etching of the alumina film for etching durations of 1 minute, 3 minutes, and 10 minutes were 0.59 nm, 0.63 nm, and 0.57 nm, respectively. It can be seen from these results that an etchant comprising an aqueous ammonium persulfate-ammonia mixed solution is not suitable for etching an alumina film.

As can be seen from the results of the second experiment, when a magnesium oxide film is wet etched using an etchant comprising an aqueous ammonium persulfate-ammonia mixed solution, the change in the amount of etching of the magnesium oxide film versus time is linear. Thus, the amount of etching of a magnesium oxide film can be easily controlled using the etching duration as a parameter.

The use of an etchant containing an aqueous ammonia solution and ammonium persulfate makes the change in the amount of etching of a magnesium oxide film versus time linear, whereas the use of an etchant consisting of an aqueous ammonium solution does not. The reason for this is thought to be as follows. When etching proceeds to some extent with the etchant consisting of an aqueous ammonia solution, the surface of the magnesium oxide film is terminated with ammonia, and this may be the reason that the etching is inhibited. On the other hand, with the etchant containing an aqueous ammonia solution and ammonium persulfate, ammonia is removed from the surface of the magnesium oxide film, and this may be the reason that the etching is not inhibited.

[Third Experiment]

The results of a third experiment will now be described. The third experiment was performed to examine the applicability of a plurality of etchants to wet etching of a plurality of materials. For the third experiment, prepared were six types of samples each of which was formed by depositing a 10 nm-thick film on a Si substrate by sputtering. Six different materials were used for the films of the six types of samples. The materials were Ta, Ru, FeNi, alumina ($Al_2O_3$), magnesium oxide (MgO), and $SiO_2$.

The following five different etchants were used in the third experiment. A first etchant was the aqueous ammonium persulfate-ammonia mixed solution used in the second experiment. A second etchant was an aqueous tetramethylammonium hydroxide solution. A third etchant was an aqueous sodium hydroxide solution. A fourth etchant was hydrochloric acid. A fifth etchant was phosphoric acid. In the third experiment, the six types of samples and the five etchants were used to examine the applicability of the five etchants to wet etching of the aforementioned six materials. The etching duration employed was 5 minutes. The etching procedure was the same as that in the first experiment.

Table 1 shows the results of the third experiment. In Table 1, the rows correspond to the respective etchants, and the columns correspond to the respective materials. A circle indicates that the entire film was etched. A triangle indicates that only part of the film was etched. A cross indicates that the film was not etched.

TABLE 1

| Etchant | Ta | Ru | FeNi | $Al_2O_3$ | MgO | $SiO_2$ |
|---|---|---|---|---|---|---|
| 1 | X | X | X | ○ | ○ | X |
| 2 | X | X | X | ○ | Δ | X |
| 3 | X | X | X | Δ | Δ | X |
| 4 | X | X | ○ | Δ | Δ | X |
| 5 | X | X | ○ | Δ | ○ | X |

As can be seen from Table 1, when etching was performed with the first etchant, nonmagnetic metals Ta and Ru and a magnetic alloy FeNi were not etched, whereas magnesium oxide was etched sufficiently. These results indicate that the first etchant, i.e., an aqueous ammonium persulfate-ammonia mixed solution, is suitable for selectively wet etching a magnesium oxide film that lies adjacent to a metal layer.

Table 1 also shows that when the second and third etchants were used, Ta, Ru, and FeNi were not etched whereas magnesium oxide was etched, as with the first etchant. The first to third etchants were then examined for the etching rate of a magnesium oxide film in a fourth experiment described below.

[Fourth Experiment]

For the fourth experiment, used were samples each formed by depositing a 30-nm-thick magnesium oxide film on a Si substrate by sputtering. The magnesium oxide films in the samples were then wet etched using the first to third etchants. The etching duration employed was 1 minute. The etching procedure was the same as that in the first experiment.

For the fourth experiment, in addition to the above samples, also prepared were samples each formed by depositing a 30-nm-thick alumina film on a Si substrate by sputtering, and the alumina films in these samples were also wet etched using the first to third etchants. The etching duration employed was also 1 minute. The etching procedure was the same as that in the first experiment.

Table 2 shows the results of the fourth experiment. In Table 2, the rows correspond to the respective film materials, and the columns correspond to the respective etchants. Figures in Table 2 indicate the amount of etching per minute, i.e., the etching rate. The unit of the etching rate is nm/min.

TABLE 2

|   | Second etchant | Third etchant | First etchant |
|---|---|---|---|
| MgO | 0.58 | 0.79 | 1.82 |
| $Al_2O_3$ | 6.42 | 3.02 | 0.59 |

As can be seen from Table 2, with the first etchant, the etching rate of the magnesium oxide film was higher than that with the second and third etchants. Thus, the first etchant, i.e., an aqueous ammonium persulfate-ammonia mixed solution, was found to be more suitable for wet etching of a magnesium oxide film than the second and third etchants.

[Fifth Experiment]

The results of a fifth experiment will now be described. The fifth experiment was performed to examine the relationship between the pH of an etchant and the etching rate. Two types of samples were prepared for the fifth experiment. The two types of samples were both formed by depositing a magnesium oxide film on a Si substrate by sputtering. The two types of samples were different in the pressure in a sputtering chamber in a sputtering apparatus used to form the magnesium oxide films. The pressure for one of the samples was 9 Pa, and that for the other was 13 Pa. The magnesium oxide thickness was 30 nm. The two types of samples were prepared for the purpose of examining the stability of the etching rates of magnesium oxide films that were formed at a pressure of 9 Pa falling below the lower bound of pressure fluctuations in the sputtering apparatus and at a pressure of 13 Pa exceeding the upper bound of the pressure fluctuations.

In the fifth experiment, the magnesium oxide films in the above-described two types of samples were wet etched using four types of etchants. The etching duration employed was 2 minutes. Each of the four types of etchants was obtained by diluting 1,800 g of ammonium persulfate and an aqueous ammonia solution containing 28% by weight of ammonia with 40 L of pure water to prepare an aqueous ammonium persulfate-ammonia mixed solution. The four types of etchants had different pH values. The pH was controlled by changing the amount of the undiluted aqueous ammonia solution. More specifically, the undiluted aqueous ammonia solution was used in amounts of 200 mL, 500 mL, 700 mL, and 1,000 mL to prepare the four types of etchants with different pH values. The greater the amount of the aqueous ammonia solution is, the higher the pH value becomes. The etching procedure was different from that in the first to fourth experiments. Specifically, the etching was performed with an etching apparatus in the following manner. A cassette with a sample mounted thereon was placed in an etching bath and shaken during etching treatment so as to promote the etching. The cassette was then immersed in a pure water bath for 1 minute and dried.

Figure 25:
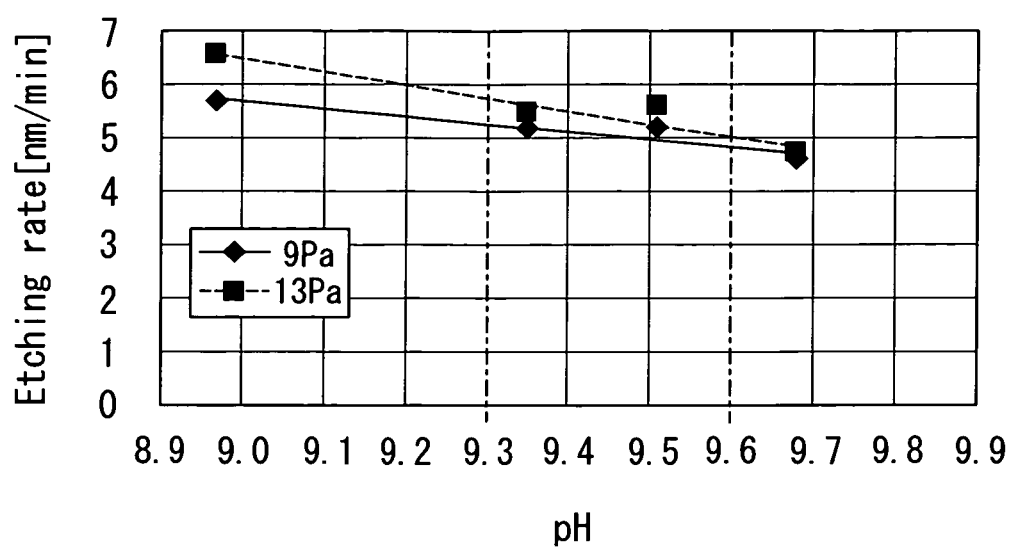
FIG. 25 is a characteristic diagram showing the results of a fifth experiment.

FIG. 25 shows the results of the fifth experiment. In FIG. 25, the horizontal axis represents the pH of the etchant, and the vertical axis represents the amount of etching per minute, i.e., the etching rate, of the magnesium oxide film. In FIG. 25, the four points and solid line denoted by symbol "9 Pa" indicate the etching rate of the magnesium oxide film formed at a pressure of 9 Pa. The solid line was produced by linear approximation using the four points denoted by symbol "9 Pa" and indicates the linear relationship between the pH of the etchant and the etching rate of the magnesium oxide film formed at a pressure of 9 Pa. Further, in FIG. 25, the four points and broken line denoted by symbol "13 Pa" indicate the etching rate of the magnesium oxide film formed at a pressure of 13 Pa. The broken line was produced by linear approximation using the four points denoted by symbol "13 Pa" and indicates the linear relationship between the pH of the etchant and the etching rate of the magnesium oxide film formed at a pressure of 13 Pa.

It can be seen from FIG. 25 that for the pH range of about 9.0 to about 9.7, although the etching rate decreased as the pH of the etchant increased, a sufficient etching rate was obtained at any pH values. To control the amount of etching of a magnesium oxide film, it is preferable to adjust the pH of the etchant so that the etching rate falls within a predetermined narrow range. From this point of view, the pH of the etchant preferably falls within the range of 9.3 to 9.6, which is the pH range including intermediate four of the eight points shown in FIG. 25 and excluding two points corresponding to the highest pH and two points corresponding to the lowest pH. An etchant having a pH in the range of 9.3 to 9.6 can be prepared by controlling the amounts of the aqueous ammonia solution, ammonium persulfate, and pure water. The results of the fifth experiment showed higher etching rates compared with the results of the first to fourth experiments. The reason for this may be that, in the fifth experiment, the etching was promoted because the cassettes with the samples mounted thereon were shaken during etching.

Now, two practical examples that employ the method of etching a magnesium oxide film according to the embodiment and three comparative examples for comparison with the practical examples will be described.

First Comparative Example

A first comparative example is for comparison with a series of steps from the step shown in FIG. 11A to FIG. 11C to the step shown in FIG. 14A and FIG. 14B in the method of manufacturing the magnetoresistive device according to the embodiment. In the first comparative example, an etching mask of a comparative example was used in place of the etching mask 62 shown in FIG. 11A to FIG. 11C. The etching mask of the comparative example includes a lower layer and an upper layer corresponding to the lower layer 621 and the upper layer 622 of the etching mask 62. The lower layer has a thickness in the range of 20 to 50 nm. The upper layer has a thickness in the range of 100 to 200 nm. The etching mask of the comparative example includes, in place of the first portion 62A of the etching mask 62, a portion having an undercut and a bottom surface in contact with the pre-second-surface portion 5Pb1 of the MR film 5P (this portion will hereinafter be referred to as the undercut mask portion). In the undercut mask portion, the width of the upper layer in the X direction is 50 nm and that of the lower layer is 10 to 20 nm. The size of the undercut is in the range of 15 to 20 nm.

In the first comparative example, the etching mask described above was used to perform a series of steps from the step shown in FIG. 12A and FIG. 12B to the step shown in FIG. 14A and FIG. 14B. In the first comparative example, ion milling was employed to etch the MR film 5P. Sputtering was employed to form the insulating films 4A and 4B and the bias magnetic field applying layers 6A and 6B. For the first comparative example, the material of the insulating films 4A and 4B is not limited to magnesium oxide, and can be any insulating material. To remove the etching mask of the comparative example, N-methyl-2-pyrrolidone (hereinafter referred to as NMP) was used.

In the first comparative example, an adhesion film was formed on the sidewall of the lower layer of the undercut mask portion when the MR film 5P was etched with the etching mask of the comparative example. Observation of the stack after the removal of the etching mask of the comparative example revealed that burrs resulting from the adhesion film remained on the pre-second-surface portion 5Pb1 of the MR film 5P. The reason for the formation of the adhesion film on the sidewall of the lower layer of the undercut mask portion is considered to be that the size of the undercut ranging from 15 nm to 20 nm is insufficient relative to the thickness of the MR film 5P ranging from 20 nm to 30 nm.

Increasing the size of the undercut may prevent the formation of the adhesion film on the sidewall of the lower layer of the undercut mask portion in the first comparative example. In the undercut mask portion of the first comparative example, however, the width of the lower layer in the X direction is 10 to 20 nm, and it is thus difficult to further reduce this width in order to increase the size of the undercut.

Second Comparative Example

A second comparative example is for comparison with a series of steps from the step shown in FIG. 11A to FIG. 11C to the step shown in FIG. 16A and FIG. 16B in the method of manufacturing the magnetoresistive device according to the embodiment. In the second comparative example, the etching mask 62 shown in FIG. 11A to FIG. 11C was used to perform a series of steps from the step shown in FIG. 12A and FIG. 12B to the step shown in FIG. 14A and FIG. 14B. In the second comparative example, ion milling was employed to etch the MR film 5P. The material used for the insulating films 4A and 4B in the second comparative example was not magnesium oxide but alumina. In the second comparative example, sputtering was employed to form the insulating films 4A and 4B and the bias magnetic field applying layers 6A and 6B. Further, NMP was used to remove the etching mask 62.

In the step of forming the insulating films 4A and 4B in the second comparative example, the alumina used to form the insulating films 4A and 4B adhered to the pre-second-surface portion 5Pb1 of the MR film 5P which was not in contact with the etching mask 62, and thereby formed an unwanted alumina film on the pre-second-surface portion 5Pb1.

In the second comparative example, ion milling was employed to etch the unwanted film 6C in the step shown in FIG. 15A and FIG. 15B. Further, in the step shown in FIG. 16A and FIG. 16B, wet etching using tetramethylammonium hydroxide as the etchant was employed to remove the unwanted alumina film on the pre-second-surface portion 5Pb1. The etching duration was 60 seconds.

In the second comparative example, there remained no burrs resulting from any adhesion film on the pre-second-surface portion 5Pb1 of the MR film 5P after the removal of the etching mask 62. Further, in the second comparative example, the above-described wet etching was able to remove the unwanted alumina film.

As can be seen from the first and second comparative examples, the etching mask 62 including the first portion 62A located above the pre-second-surface portion 5Pb1 of the MR film 5P is suitable as the etching mask used to provide the MR film 5P with the side surfaces 5e and 5f and to form the insulating films 4A and 4B on the side surfaces 5e and 5f. As previously mentioned, the material of the insulating films 4A and 4B in the second comparative example is alumina. When the material of the insulating films 4A and 4B is magnesium oxide as in the embodiment, the unwanted magnesium oxide film 4C formed on the pre-second-surface portion 5Pb1 of the MR film 5P cannot be removed by wet etching using tetramethylammonium hydroxide as the etchant.

First Practical Example

A first practical example is a specific example of a series of steps from the step shown in FIG. 11A to FIG. 11C to the step shown in FIG. 16A and FIG. 16B in the method of manufacturing the magnetoresistive device according to the embodiment. In the first practical example, the etching mask 62 shown in FIG. 11A to FIG. 11C was used to perform a series of steps from the step shown in FIG. 12A and FIG. 12B to the step shown in FIG. 14A and FIG. 14B. In the first practical example, ion milling was employed to etch the MR film 5P. Sputtering was employed to form the insulating films 4A and 4B and the bias magnetic field applying layers 6A and 6B. Further, NMP was used to remove the etching mask 62.

In the first practical example, ion milling was employed to etch the unwanted film 6C in the step shown in FIG. 15A and FIG. 15B. Further, in the step shown in FIG. 16A and FIG. 16B, wet etching using the etchant of the embodiment comprising an aqueous ammonium persulfate-ammonia mixed solution was employed to remove the unwanted magnesium oxide film 4C. The etching duration was 60 seconds.

In the first practical example, there remained no burrs resulting from any adhesion film on the pre-second-surface portion 5Pb1 of the MR film 5P after the etching mask 62 was lifted off. Further, in the first practical example, the above-described wet etching was able to remove the unwanted magnesium oxide film 4C.

Third Comparative Example

A third comparative example is for comparison with a series of steps from the step shown in FIG. 17A and FIG. 17B to the step shown in FIG. 21A and FIG. 21B in the method of manufacturing the magnetoresistive device according to the embodiment. In the third comparative example, the etching mask 64 shown in FIG. 17A and FIG. 17B was used to perform a series of steps from the step shown in FIG. 18A and FIG. 18B to the step shown in FIG. 20A and FIG. 20B. In the third comparative example, ion milling was employed to etch the MR film 5P and the bias magnetic field applying layers 6A and 6B. The material used for the insulating refill layer 7 in the third comparative example was not magnesium oxide but alumina. In the third comparative example, sputtering was employed to form the insulating refill layer 7. Further, NMP was used to remove the etching mask 64.

In the step of forming the insulating refill layer 7 in the third comparative example, the alumina used to form the insulating refill layer 7 was deposited also on a part of the pre-second-surface portion 5Pb1 of the MR film 5P that was not in contact with the etching mask 64, and thereby formed an unwanted alumina film on the pre-second-surface portion 5Pb1.

In the third comparative example, wet etching using tetramethylammonium hydroxide as the etchant was employed to remove the unwanted alumina film on the pre-second-surface portion 5Pb1 in the step shown in FIG. 21A and FIG. 21B. The etching duration was 60 seconds.

In the third comparative example, the above-described wet etching was able to remove the unwanted alumina film. As previously mentioned, the material of the insulating refill layer 7 in the third comparative example is alumina. When the material of the insulating refill layer 7 is magnesium oxide as in the embodiment, the unwanted magnesium oxide film 7C formed on the pre-second-surface portion 5Pb1 of the MR film 5P cannot be removed by wet etching using tetramethylammonium hydroxide as the etchant.

Second Practical Example

A second practical example is a specific example of a series of steps from the step shown in FIG. 17A and FIG. 17B to the step shown in FIG. 21A and FIG. 21B in the method of manufacturing the magnetoresistive device according to the embodiment. In the second practical example, the etching mask 64 shown in FIG. 17A and FIG. 17B was used to perform a series of steps from the step shown in FIG. 18A and FIG. 18B to the step shown in FIG. 20A and FIG. 20B. In the second practical example, ion milling was employed to etch the MR film 5P and the bias magnetic field applying layers 6A and 6B. Sputtering was employed to form the insulating refill layer 7. Further, NMP was used to remove the etching mask 64.

In the second practical example, wet etching using the etchant of the embodiment comprising an aqueous ammonium persulfate-ammonia mixed solution was employed to remove the unwanted magnesium oxide film 7C. The etching duration was 60 seconds.

In the second practical example, the above-described wet etching was able to remove the unwanted magnesium oxide film 7C.

The present invention is not limited to the foregoing embodiment, and various modifications may be made thereto. For example, the etching method of the present invention can be used for removal of an unwanted magnesium oxide film adjacent to a metal layer in the process of manufacture of not only a magnetoresistive device for use as a read head unit of a magnetic head but also various micro-devices such as semiconductor devices, sensors using thin films, and actuators using thin films.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A method of manufacturing a magnetoresistive device, the magnetoresistive device including: a first electrode and a second electrode located at a distance from each other; a magnetoresistive element including a metal layer and disposed between the first electrode and the second electrode; and an insulating portion in contact with the magnetoresistive element, wherein the magnetoresistive element has a first surface in contact with the first electrode, a second surface in contact with the second electrode, and a third surface connecting the first and second surfaces to each other, the metal layer includes the second surface, and the insulating portion is made of magnesium oxide, the method comprising the steps of:

forming the first electrode;

forming a magnetoresistive film on the first electrode, the magnetoresistive film becoming the magnetoresistive element later and having a top surface including a pre-second-surface-portion that later becomes the second surface;

patterning the magnetoresistive film so that the magnetoresistive film is provided with at least part of the third surface;

forming the insulating portion from magnesium oxide such that the insulating portion is in contact with the at least part of the third surface;

removing an unwanted magnesium oxide film that has been formed on the pre-second-surface portion by the magnesium oxide in the step of forming the insulating portion; and forming the second electrode after the step of removing the unwanted magnesium oxide film, wherein in the step of removing the unwanted magnesium oxide film, the unwanted magnesium oxide film is wet etched by using an etchant containing an aqueous ammonia solution.

2. The method according to claim 1, wherein the etchant further contains ammonium persulfate.

3. The method according to claim 2, wherein the etchant has a pH in the range of 9.3 to 9.6.

4. The method according to claim 1, wherein the magnetoresistive element includes a first magnetic layer, a second magnetic layer, and a magnesium oxide layer, the first magnetic layer is located between the first surface and the magnesium oxide layer, the second magnetic layer is located between the second surface and the magnesium oxide layer, the magnesium oxide layer has an end located in the third surface, and the insulating portion is in contact with the end of the magnesium oxide layer.

5. The method according to claim 1, wherein the magnetoresistive device is for use in a thin-film magnetic head having a medium facing surface facing a recording medium, and the third surface of the magnetoresistive element includes a front end face located in the medium facing surface, a rear end face opposite to the front end face, and a first side surface and a second side surface opposite to each other in a track width direction.

6. The method according to claim 5, wherein in the step of patterning the magnetoresistive film, an etching mask is formed on the magnetoresistive film and the magnetoresistive film is dry etched by using the etching mask to thereby provide the magnetoresistive film with the first and second side surfaces, in the step of forming the insulating portion, the insulating portion is formed to be in contact with the first and second side surfaces with the etching mask left unremoved, and in the step of removing the unwanted magnesium oxide film, the unwanted magnesium oxide film is wet etched after the etching mask is removed.

7. The method according to claim 6, wherein the etching mask includes a first portion located above the pre-second-surface portion, and a second portion that is in contact with a part of the top surface of the magnetoresistive film other than the pre-second-surface portion and supports the first portion.

8. The method according to claim 6, wherein the magnetoresistive device further includes a first bias magnetic field applying layer and a second bias magnetic field applying layer that apply a bias magnetic field to the magnetoresistive element, the first bias magnetic field applying layer is adjacent to the first side surface with the insulating portion interposed therebetween, the second bias magnetic field applying layer is adjacent to the second side surface with the insulating portion interposed therebetween, each of the first and second bias magnetic field applying layers has a top surface and includes a metal layer made of a magnetic alloy and exposed in the top surface, and the method further comprises the step of forming the first and second bias magnetic field applying layers.

9. The method according to claim 5, wherein
in the step of patterning the magnetoresistive film, an etching mask is formed on the magnetoresistive film and the magnetoresistive film is dry etched by using the etching mask to thereby provide the magnetoresistive film with the rear end face,
in the step of forming the insulating portion, the insulating portion is formed to be in contact with the rear end face with the etching mask left unremoved, and
in the step of removing the unwanted magnesium oxide film, the unwanted magnesium oxide film is wet etched after the etching mask is removed.

10. The method according to claim 9, wherein the etching mask has an undercut.

* * * * *